(12) United States Patent
Han

(10) Patent No.: US 8,563,413 B2
(45) Date of Patent: Oct. 22, 2013

(54) SEMICONDUCTOR DEVICE WITH BURIED GATE AND METHOD FOR FABRICATING THE SAME

(75) Inventor: Sang-Yup Han, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 253 days.

(21) Appl. No.: 12/640,265

(22) Filed: Dec. 17, 2009

(65) Prior Publication Data

US 2010/0207203 A1 Aug. 19, 2010

(30) Foreign Application Priority Data

Feb. 19, 2009 (KR) .................. 10-2009-0013960

(51) Int. Cl.
 *H01L 21/3205* (2006.01)
(52) U.S. Cl.
 USPC ............... 438/589; 257/330; 257/E29.262
(58) Field of Classification Search
 USPC ............ 257/330, E29.262, E21.19; 438/589
 See application file for complete search history.

(56) References Cited

U.S. PATENT DOCUMENTS

| | | | |
|---|---|---|---|
| 7,078,296 B2* | 7/2006 | Chau et al. | 438/270 |
| 2001/0025973 A1* | 10/2001 | Yamada et al. | 257/296 |
| 2004/0084701 A1* | 5/2004 | Kanaya et al. | 257/295 |
| 2009/0101881 A1* | 4/2009 | Song et al. | 257/2 |
| 2010/0109062 A1* | 5/2010 | Kadoya | 257/296 |

FOREIGN PATENT DOCUMENTS

| | | |
|---|---|---|
| JP | 2003-037185 | 2/2003 |
| JP | 2003-158201 | 5/2003 |
| KR | 1020020074408 | 9/2002 |
| KR | 100379612 | 4/2003 |

OTHER PUBLICATIONS

Notice of Preliminary Rejection issued from Korean Intellectual Property Office on Dec. 18, 2010.
Notice of Allowance issued from Korean Intellectual Property Office on Aug. 24, 2011.

* cited by examiner

*Primary Examiner* — Shaun Campbell
(74) *Attorney, Agent, or Firm* — IP & T Group LLP

(57) ABSTRACT

A Semiconductor device includes a substrate having an active region defined by a device isolation layer, a trench formed by etching the active region and the device isolation layer, a buried gate filling a portion of the trench, an interlayer insulation layer formed over the buried gate and filling a remainder of the trench, and an oxidation protecting layer formed between the buried gate and the device isolation layer.

15 Claims, 17 Drawing Sheets

SEMICONDUCTOR DEVICE WITH BURIED GATE AND METHOD FOR FABRICATING THE SAME

CROSS-REFERENCE TO RELATED APPLICATIONS

The present application claims priority of Korean Patent Application No. 10-2009-0013960, filed on Feb. 19, 2009, which is incorporated herein by reference in its entirety.

BACKGROUND OF THE INVENTION

Exemplary embodiments of the present invention relate to a semiconductor device and a method for fabricating the same, and more particularly, to a semiconductor device with a buried gate and a method for fabricating the same.

Recently, a fabrication process of a semiconductor device, such as a dynamic random access memory (DRAM), has been developed to improve integration degree. As the semiconductor device is highly integrated, two important concerns regarding the fabrication process arise. The first concern regards the degradation of contact holes when the fine patterns are formed. The second concern regards the guarantee of capacitance of capacitors.

In order to address the above concerns, the reliability of the semiconductor device may be secured by applying a buried gate to the semiconductor device.

FIG. 1 is a cross-sectional view illustrating a conventional semiconductor device with a buried gate.

Referring to FIG. 1, the conventional semiconductor device with the buried gate includes a semiconductor substrate 11, a device isolation layer 12 formed by etching a portion of the semiconductor substrate 11, an active region 13 defined by the device isolation layer 12 in the semiconductor substrate 11, a trench 14 formed by etching portions of the active region 13 and the device isolation layer 12, a gate insulation layer 15 formed over the surface of the trench 14 in the active region 13, a buried gate 16 filling a portion of the trench 14, and an interlayer insulation layer 17 formed over the buried gate 16 and filling the remainder of the trench 14.

The buried gate 16 is formed of a metal layer, and the device isolation layer 12 is formed of an oxide layer.

In the conventional semiconductor device with the buried gate, because the buried gate 16 makes direct contact with the device isolation layer 12, deterioration (e.g., the oxidation 18) of the buried gate 16 occurs when a reaction takes place between the buried gate 16 and the device isolation layer 12. Further, the reliability of the semiconductor device is degraded due to the deterioration of the buried gate 16.

Also, the buried gate of the conventional semiconductor device is easily oxidized by a subsequent thermal process such as an interlayer insulation formation process.

SUMMARY OF THE INVENTION

An embodiment of the present invention is directed to a semiconductor device and a method for fabricating the same which can prevent deterioration of a buried gate from direct contact with a device isolation layer.

Another embodiment of the present invention is directed to a semiconductor device and a method for fabricating the same which can prevent oxidation of a buried gate due to a subsequent thermal process.

In accordance with an embodiment of the present invention, a semiconductor device includes a substrate having an active region defined by a device isolation layer, a trench formed by etching the active region and the device isolation layer, a buried gate filling a portion of the trench, an interlayer insulation layer formed over the buried gate and filling a remainder of the trench, and an oxidation protecting layer formed between the buried gate and the device isolation layer.

In accordance with another embodiment of the present invention, a semiconductor device includes a substrate having an active region defined by a device isolation layer, a trench formed by etching the active region and the device isolation layer, a buried gate filling a portion of the trench, an interlayer insulation layer formed over the buried gate and filling a remainder of the trench, and an oxidation protecting layer formed between the buried gate and the interlayer insulation layer.

In accordance with yet another embodiment of the present invention, a semiconductor device includes a substrate having an active region defined by a device isolation layer, a trench formed by etching the active region and the device isolation layer, a buried gate filling a portion of the trench, an interlayer insulation layer formed over the buried gate and filling a remainder of the trench, a first oxidation protecting layer formed between the buried gate and the device isolation layer, and a second oxidation protecting layer formed between the buried gate and the interlayer insulation layer.

In accordance with still another embodiment of the present invention, a method for fabricating a semiconductor device includes providing a substrate having an active region defined by a device isolation layer, forming a trench by etching the active region and the device isolation layer, forming an oxidation protecting layer over the trench in the device isolation layer, forming a buried gate filling a portion of the trench, and forming an interlayer insulation layer formed over the buried gate and filling a remainder of the trench.

In accordance with still another embodiment of the present invention, a method for fabricating a semiconductor device includes providing a substrate having an active region defined by a device isolation layer, forming a trench by etching the active region and the device isolation layer, forming a buried gate filling a portion of the trench, forming an oxidation protecting layer over the buried gate, and forming an interlayer insulation layer over the oxidation protecting layer and filling a remainder of the trench.

In accordance with still another embodiment of the present invention, a method for fabricating a semiconductor device includes providing a substrate having an active region defined by a device isolation layer, forming a trench by etching the active region and the device isolation layer, forming a first oxidation protecting layer over the trench, forming a buried gate over the first oxidation protecting layer and filling a portion of the trench, forming a second oxidation protecting layer over the buried gate, and forming an interlayer insulation layer over the second oxidation protecting layer and filling a remainder of the trench.

In accordance with still another embodiment of the present invention, a method for fabricating a semiconductor device includes providing a substrate having an active region defined by a device isolation layer, forming a trench by etching the active region and the device isolation layer, forming a first oxidation protecting layer over the trench in the device isolation layer, forming a gate insulation layer over the trench in the active region, forming a buried gate filling a portion of the trench, forming a second oxidation protecting layer over the buried gate, and forming an interlayer insulation layer over the second oxidation protecting layer and gap-filling the trench.

DESCRIPTION OF SPECIFIC EMBODIMENTS

Figure 1:
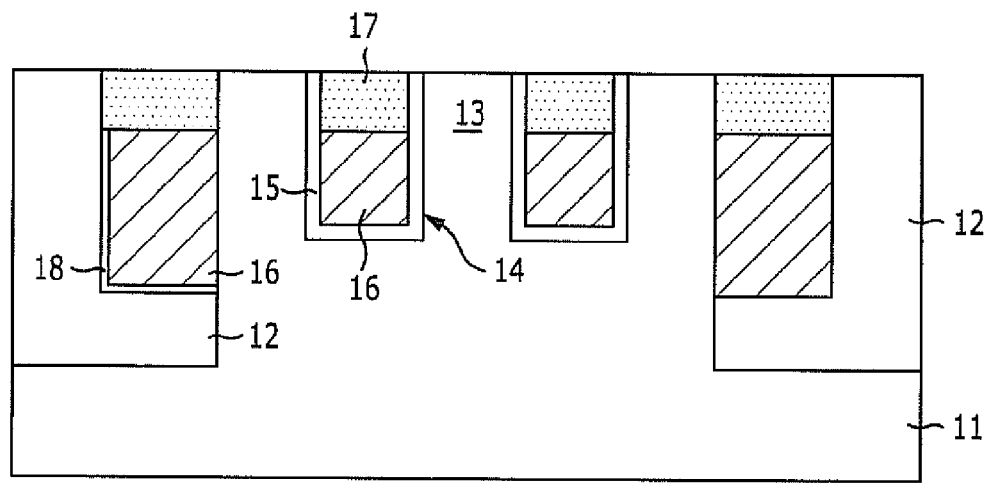
FIG. 1 is a cross-sectional view illustrating a conventional semiconductor device with a buried gate.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it may not only refer to a case where the first layer is formed directly on the second layer or the substrate, but also may refer to a case where a third layer exists between the first layer and the second layer or the substrate.

Figure 2:
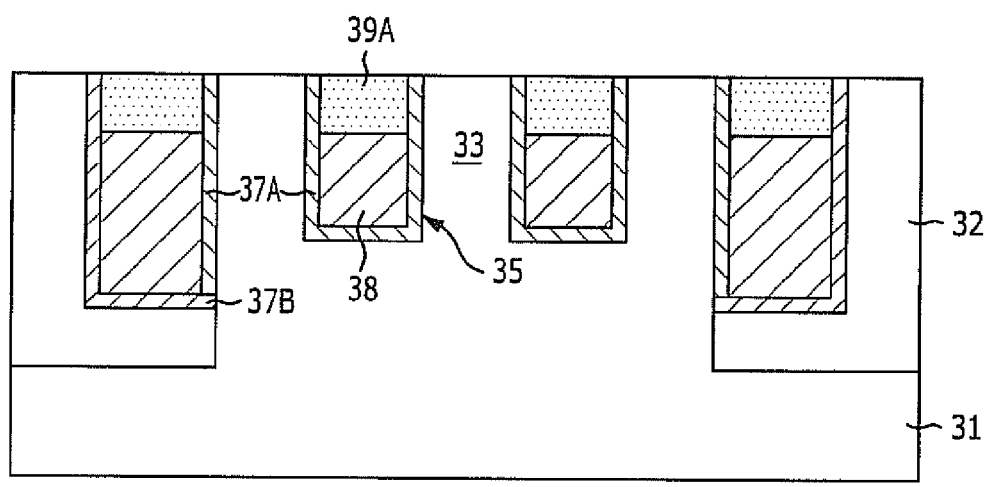
FIG. 2 is a cross-sectional view illustrating a semiconductor device with a buried gate in accordance with a first embodiment of the present invention.

FIG. 2 is a cross-sectional view illustrating a semiconductor device with a buried gate in accordance with a first embodiment of the present invention.

Referring to FIG. 2, the semiconductor device with the buried gate in accordance with the first embodiment of the present invention includes a semiconductor substrate 31, a device isolation layer 32 formed by performing a shallow trench isolation (STI) process to the semiconductor substrate 31, an active region 33 defined by the device isolation layer 32 in the semiconductor substrate 31, a trench 35 formed by etching a portion of the active region 33 and the device isolation layer 32, a buried gate 38 filling a portion of the trench 35, and an interlayer insulation layer 39A formed over the buried gate 38 and filling the remainder of the trench 35.

The semiconductor device with the buried gate may further include a gate insulation layer 37A formed between the active region 33 and the buried gate 38, and an oxidation protecting layer 37B formed between the device isolation layer 32 and the buried gate 38.

The trench 35 may be a line-type trench and is formed by etching the portions of the active region 33 and the device isolation layer 32 simultaneously. The depth of the trench 35 in the device isolation layer 32 may be greater than that of the trench 35 in the active region 33 due to a difference in etch selectivity between the device isolation layer 32 and the active region 33. A channel region is formed below the buried gate 38 due to the trench 35, and the length of channel is increased.

The buried gate 38 may be formed of titanium nitride (TiN), tungsten (W), or a stack structure of the titanium nitride (TiN) and the tungsten (W). A sheet resistance of a gate may be decreased remarkably due to the buried gate structure, and thus the buried gate may be applied to a highly integrated semiconductor device under 30 nm. Since the buried gate 38 is formed to fill the portion of the trench 35, the subsequent processes (e.g., contact formation processes) are easily performed, and therefore, the buried gate structure has an advantage over a recess gate structure with regards to integration degree.

The interlayer insulation layer 39A may be formed of a nitride layer, an oxide layer, or a stack structure of the nitride layer and the oxide layer. The interlayer insulation layer 39A includes a spin on dielectric (SOD) formed of polysilazane (PSZ) having a good gap-fill characteristic. The interlayer insulation layer 39A is a silicon oxide layer $SiO_2$ formed by depositing the polysilazane (PSZ) and performing a high-temperature thermal process (e.g., bake or curing at temperature more than 800° C.) onto the PSZ in an environment containing oxygen.

The oxidation protecting layer 37B prevents a reaction between the buried gate 38 and the device isolation layer 32. Also, the gate insulation layer 37A and the oxidation protecting layer 37B may be formed of the same material. For example, the oxidation protecting layer 37B and the gate insulation layer 37A may include an insulation layer formed of a nitride-based material (e.g., silicon oxynitride (SiON)). A method for forming the silicon oxynitride will be described later when a method for fabricating the semiconductor device with the buried gate is described. Contrary to a silicon oxide layer, the silicon oxynitride prevents the reaction between the buried gate 38 and the device isolation layer 32 because the silicon oxynitride contains nitrogen of a predetermined concentration level within the layer. Particularly, when the device isolation layer 32 is formed of a spin on dielectric (SOD), the reaction between the buried gate 38 and the device isolation layer 32 is effectively prevented.

FIGS. 3A to 3F are cross-sectional views illustrating a method for fabricating the semiconductor device with the buried gate shown in FIG. 2.

Figure 3A:
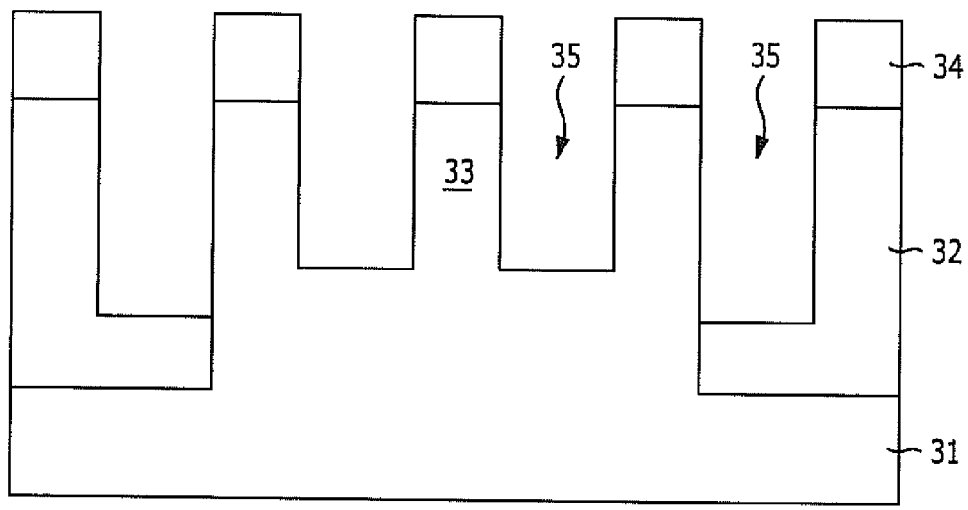
FIGS. 3A to 3F are cross-sectional views illustrating a method for fabricating the semiconductor device with the buried gate shown in FIG. 2.

Referring to FIG. 3A, a device isolation layer 32 is formed by performing a shallow trench isolation (STI) process to a semiconductor substrate 31. The semiconductor substrate 31 includes a silicon substrate, and the device isolation layer 32 includes an oxide layer, such as a high density plasma oxide (HDP oxide) and a spin on dielectric (SOD). That is, the device isolation layer 32 is formed of the SOD having a good gap-fill characteristic. The SOD includes a silicon oxide formed of a polysilazane (PSZ). An active region 33 is defined by the device isolation layer 32.

A trench 35 is formed in a region to be filled with the buried gate 38. The trench 35 is formed by etching the semiconductor substrate 31 using a hard mask 34 as an etch barrier. The trench 35 is formed by etching the active region 33 and the device isolation layer 32. Because a general gate is a line-type, the trench 35 is a line-type too. The line-type trench 35 is formed by etching the active region 33 and the device isolation layer 32 simultaneously.

The etch loss of the device isolation layer 32 is larger than that of the active region 33 due to a difference in etch selectivity between the device isolation layer 32 and the active region 33. Therefore, the depth of the trench 35 in the device isolation layer 32 may be greater than that of the trench 35 in the active region 33.

The hard mask 34 is patterned by using a photoresist pattern (not shown). The hard mask 34 is formed of a material having a greater etch selectivity than the semiconductor substrate 31. The hard mask 34 may be a stack structure of an oxide layer and a nitride layer. When the hard mask 34 is applied to form the trench 35, the photoresist pattern may be stripped after the trench 35 is formed.

Figure 3B:
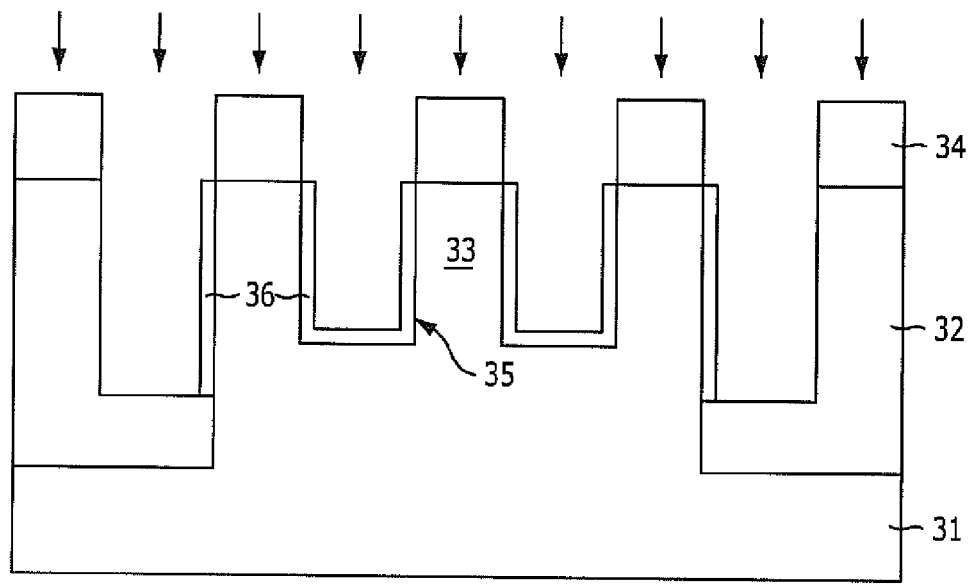

Referring to FIG. 3B, the surface of the trench 35 is oxidized. The oxidation process of the surface of the trench 35 includes thermal oxidation, which is a formation process of the conventional gate insulation layer.

As the surface of the trench 35 is oxidized by the oxidation process, a silicon oxide layer ($Si_xO_y$) is formed. Since the semiconductor substrate 31 is silicon substrate, a silicon oxide layer ($SiO_2$) 36 is formed by the oxidation process.

Figure 3C:
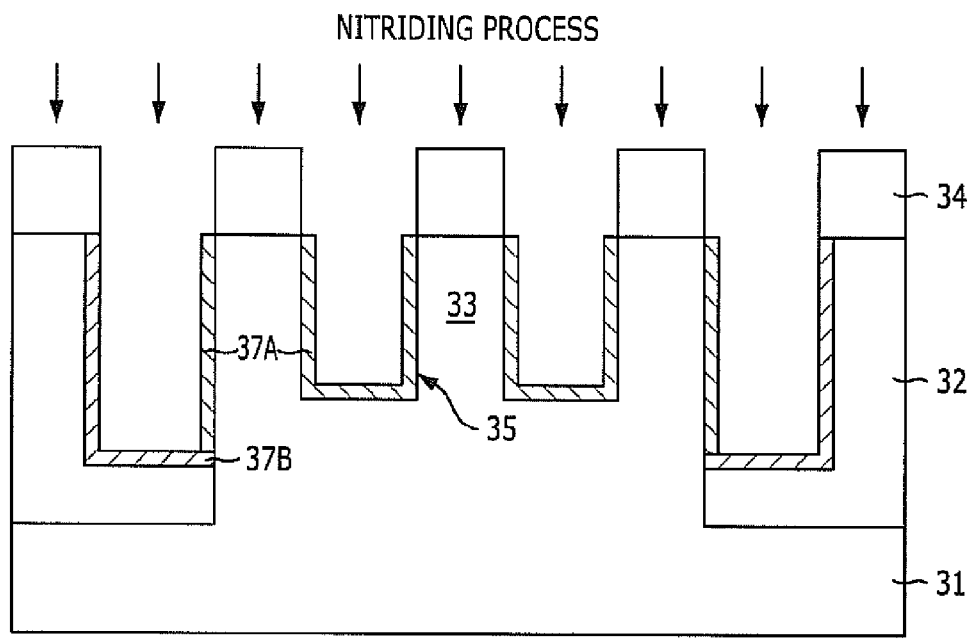

Referring to FIG. 3C, the silicon oxide layer 36 is nitrided by a nitriding process in an environment containing nitrogen. As a result, a first silicon oxynitride layer (SiON) 37A is formed over the surface of the trench 35 in the active region 33. While the nitriding process is performed, the trench 35 in the device isolation layer 32 is exposed. Thus, the surface of the trench 35 in the device isolation layer 32 is nitrided as well. Also, since the device isolation layer 32 is the silicon oxide layer, a second silicon oxynitride layer (SiON) 37B is formed over the surface of the trench 35 in the device isolation layer 32.

Thus, the first silicon oxynitride layer 37A and the second silicon oxynitride layer 37B cover the bottom and the sidewalls of the trench 35. The first silicon oxynitride layer 37A formed in the active region 33 serves as a gate insulation layer formed below the buried gate 38. The second silicon oxynitride layer 37B formed in the device isolation layer 32 serves as an oxidation protecting layer, which prevents the reaction between the buried gate 38 and the device isolation layer 32. The nitriding process includes a thermal process and a plasma process. The thermal process is performed in a nitrogen environment, such as $N_2$ or $NH_3$, at a temperature ranging from approximately 300° C. to approximately 1000° C., under a pressure ranging from tens of mTorr to 760 Torr. The plasma process is performed at a temperature lower than approximately 1000° C., under a pressure lower than 10 mTorr in a nitrogen environment, such as $N_2$ or $NH_3$.

Hereinafter, the second silicon oxynitride layer 37B formed over the trench 35 in the device isolation layer 32 is denoted as 'the oxidation protecting layer' 37B, and first silicon oxynitride layer 37A formed over the trench 35 in the active region 33 is denoted as 'the gate insulation layer' 37A.

Figure 3D:
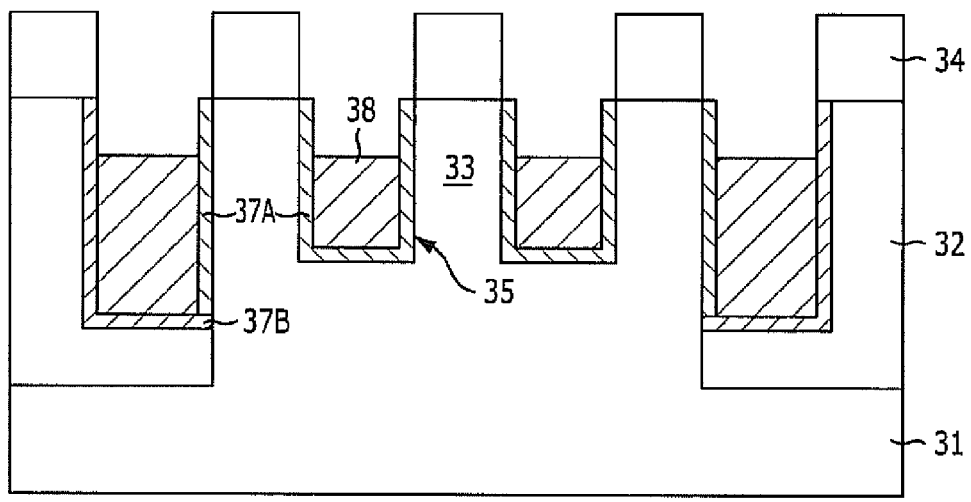

Referring to FIG. 3D, the buried gate 38 filling a portion of the trench 35 is formed by depositing a metal layer to fill the trench 35 with the oxidation protecting layer 37B and the gate insulation layer 37A, performing a chemical mechanical polishing (CMP) process, and performing an etch back process. The metal layer includes titanium nitride (TiN), tungsten (W), or a stack structure of the titanium nitride (TiN) and the tungsten (W).

The buried gate 38 fills a portion of the trench 35 in the active region 33 and a portion of the trench 35 in the device isolation layer 32. Since the oxidation protecting layer 37B is formed below the buried gate 38 in the device isolation layer 32, a reaction between the buried gate 38 and the device isolation layer 32 is prevented.

Figure 3E:
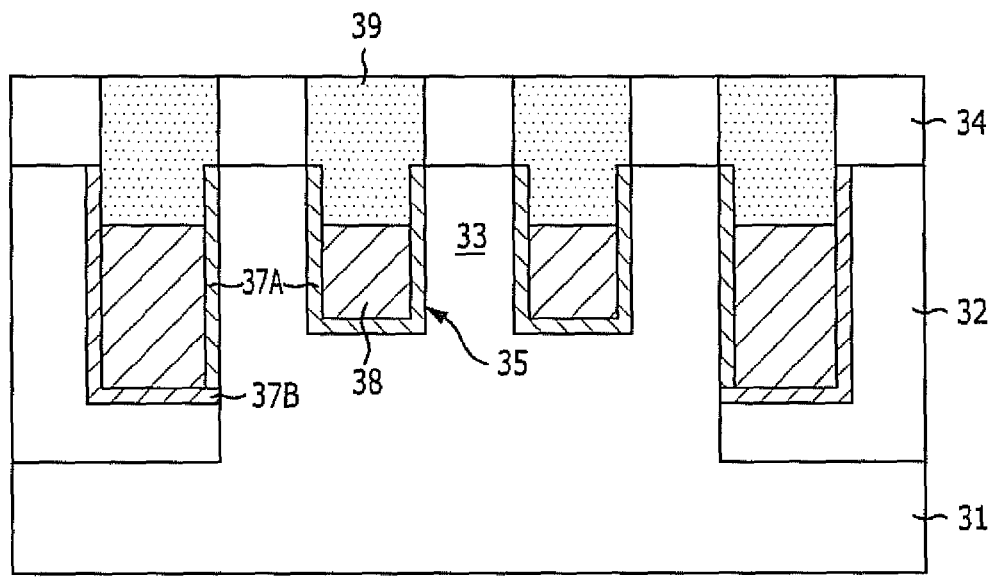

Referring to FIG. 3E, an interlayer insulation layer 39 is formed and planarized to insulate the buried gate 38 from upper contact holes and upper metal lines. The interlayer insulation layer 39 includes a nitride layer, an oxide layer, or a stack structure of the nitride layer and the oxide layer. The interlayer insulation layer 39 includes a spin on dielectric (SOD) formed of a polysilazane (PSZ). The interlayer insulation layer 39 is a silicon oxide layer ($SiO_2$) formed by depositing the polysilazane (PSZ) and performing a subsequent high-temperature thermal process (e.g., bake or curing) onto the PSZ in an oxygen environment.

Figure 3F:
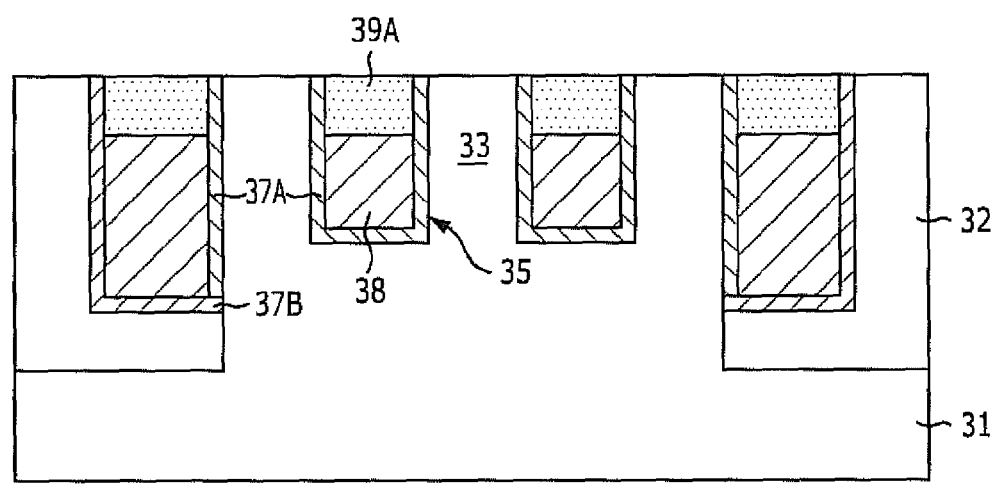

Referring to FIG. 3F, the hard mask 34 is removed. While the hard mask 34 is removed, a portion of the interlayer insulation layer 39 is removed to form an etched interlayer insulation layer 39A. Thus, the etched interlayer insulation layer 39A formed over the buried gate 38 fills the remainder of the trench 35.

According to the first embodiment of the present invention, the oxidation protecting layer 37B is formed between the device isolation layer 32 and the buried gate 38 to prevent the reaction between the buried gate 38 and the device isolation layer 32.

Figure 4:
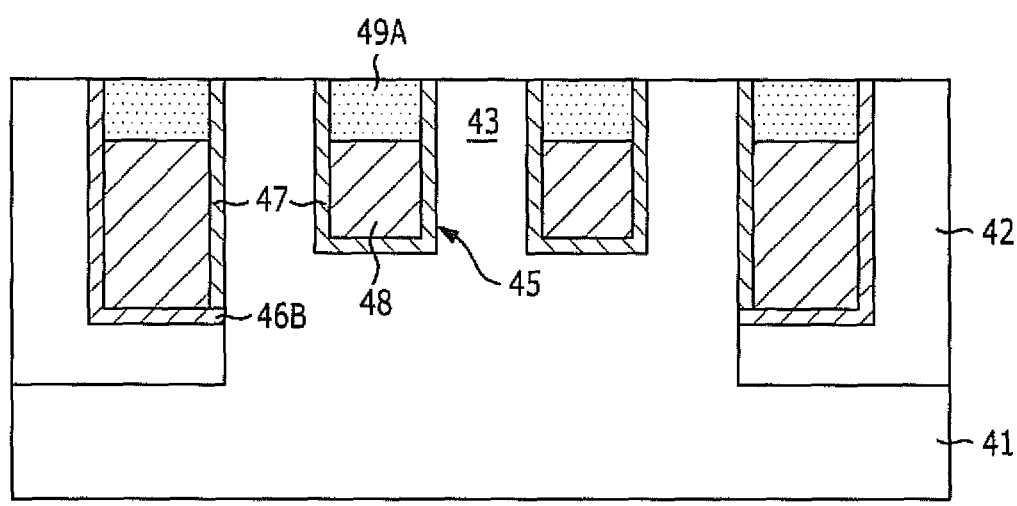
FIG. 4 is a cross-sectional view illustrating a semiconductor device with a buried gate in accordance with a second embodiment of the present invention.

FIG. 4 is a cross-sectional view illustrating a semiconductor device with a buried gate in accordance with a second embodiment of the present invention.

Referring to FIG. 4, the semiconductor device with the buried gate in accordance with the second embodiment of the present invention includes a semiconductor substrate 41, a device isolation layer 42 formed by performing a shallow trench isolation (STI) process to the semiconductor substrate 41, an active region 43 defined by the device isolation layer 42 in the semiconductor substrate 41, a trench 45 formed by etching a portion of the active region 43 and the device isolation layer 42, a buried gate 48 filling a portion of the trench 45, and an interlayer insulation layer 49A formed over the buried gate 48 and filling the remainder of the trench 45.

The semiconductor device with the buried gate in accordance with the second embodiment of the present invention may further include a gate insulation layer 47 formed between the active region 43 and the buried gate 48, and an oxidation protecting layer 46B formed between the device isolation layer 42 and the buried gate 48.

The trench 45 may be a line-type trench and is formed by etching the portions of the active region 43 and the device isolation layer 42 simultaneously. The depth of the trench 45 in the device isolation layer 42 may be greater than that of the trench 45 in the active region 43 due to a difference in etch selectivity between the device isolation layer 42 and the active region 43. A channel region is formed below the buried gate 48 due to the trench 45, and the length of channel is increased.

The buried gate 48 may be formed of titanium nitride (TiN), tungsten (W), or a stack structure of the titanium nitride (TiN) and the tungsten (W). A sheet resistance of a gate may be decreased remarkably due to the buried gate structure, and thus, the buried gate may be applied to a highly integrated semiconductor device under 30 nm. Since the buried gate 48 is formed to fill the portion of the trench 45, the subsequent processes (e.g., contact formation processes) are easily performed, and the buried gate structure has an advantage over a recess gate structure where integration is high.

The interlayer insulation layer 49A may be formed of a nitride layer, an oxide layer, or a stack structure of the nitride layer and the oxide layer. The interlayer insulation layer 49A includes a spin on dielectric (SOD) formed of polysilazane (PSZ) having a good gap-fill characteristic. The interlayer insulation layer 49A is a silicon oxide layer ($SiO_2$) formed by depositing the Polysilazane (PSZ) and performing a high-temperature thermal process (e.g., bake or curing at temperature more than 800° C.) onto the PSZ in an oxygen environment.

The oxidation protecting layer 46B prevents a reaction between the buried gate 48 and the device isolation layer 42. The oxidation protecting layer 46B includes a silicon oxynitride (SiON). A method for forming the silicon oxynitride will be described later when a method for fabricating the semiconductor device with the buried gate is described. Contrary to a silicon oxide layer, the silicon oxynitride prevents the reaction between the buried gate 48 and the device isolation layer 42 because the silicon oxynitride contains nitrogen of a predetermined concentration level within the layer. Particularly, when the device isolation layer 42 is formed of a spin on dielectric (SOD), the reaction between the buried gate 48 and the device isolation layer 42 is effectively prevented.

The gate insulation layer 47 includes a silicon oxide. A method for forming the silicon oxide will be described later when a method for fabricating the semiconductor device with the buried gate is described.

FIGS. 5A to 5G are cross-sectional views illustrating a method for fabricating the semiconductor device with the buried gate shown in FIG. 4.

Figure 5A:
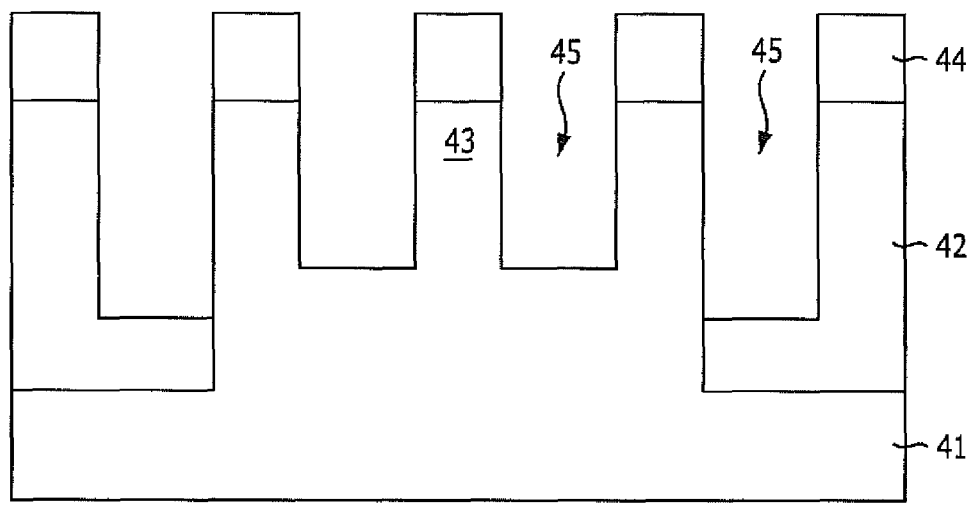
FIGS. 5A to 5G are cross-sectional views illustrating a method for fabricating the semiconductor device with the buried gate shown in FIG. 4.

Referring to FIG. 5A, a device isolation layer 42 is formed by performing a shallow trench isolation (STI) process to a semiconductor substrate 41. The semiconductor substrate 41 includes a silicon substrate, and the device isolation layer 42 includes an oxide layer, such as a high density plasma oxide (HDP oxide) and a spin on dielectric (SOD). That is, the device isolation layer 42 is formed of the SOD having a good gap-fill characteristic. The SOD includes a silicon oxide formed of a polysilazane (PSZ). An active region 43 is defined by the device isolation layer 42.

A trench 45 is formed in a region to be filled with the buried gate 48. The trench 45 is formed by etching the semiconductor substrate 41 using a hard mask 44 as an etch barrier. The trench 45 is formed by etching the active region 43 and the device isolation layer 42. Because a general gate is a line-type, the trench 45 is a line-type too. The line-type trench 45 is formed by etching the active region 43 and the device isolation layer 42 simultaneously. The etch loss of the device isolation layer 42 is larger than that of the active region 43 due to a difference in etch selectivity between the device isolation layer 42 and the active region 43. Therefore, the depth of the trench 45 in the device isolation layer 42 may be greater than that of the trench 45 in the active region 43.

The hard mask 44 is patterned by using a photoresist pattern (not shown). The hard mask 44 is formed of a material having a greater etch selectivity than the semiconductor substrate 41. The hard mask 44 may be a stack structure of an oxide layer and a nitride layer. When the hard mask 44 is applied to form the trench 45, the photoresist pattern may be stripped after the trench 45 is formed.

Figure 5B:
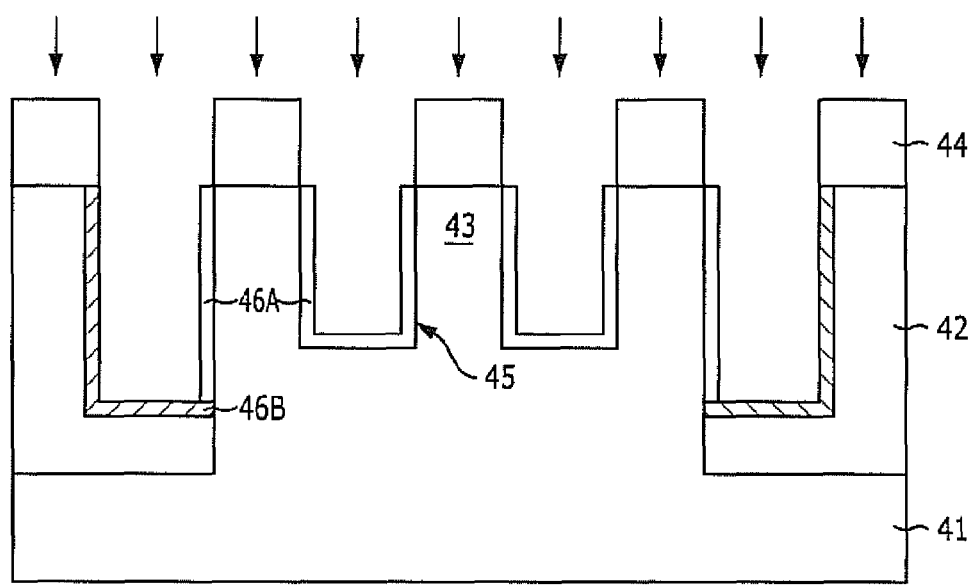

Referring to FIG. 5B, the surface of the trench 45 is nitrided by a nitriding process in a nitrogen environment. As a result, a silicon nitride layer ($Si_3N_4$) 46A is formed over the surface of the trench 45 in the active region 43. When the nitriding process is performed, the trench 45 in the device isolation layer 42 is exposed. Thus, the surface of the trench 45 in the device isolation layer 42 is nitrided as well. Also, since the device isolation layer 42 is the silicon oxide layer, a silicon oxynitride layer (SiON) 46B is formed over the surface of the trench 45 in the device isolation layer 42. The silicon oxynitride layer 46B formed in the device isolation layer 42 serves as an oxidation protecting layer, which prevents the reaction between the buried gate 48 and the device isolation layer 42.

The nitriding process includes a thermal process and a plasma process. The thermal process is performed in a nitrogen environment, such as $N_2$ or $NH_3$, at a temperature ranging from approximately 300° C. to approximately 1000° C., under a pressure ranging from tens of mTorr to 760 Torr. The plasma process is performed at a temperature lower than approximately 600° C., under a pressure lower than 10 mTorr in a nitrogen environment, such as $N_2$ or $NH_3$.

Figure 5C:
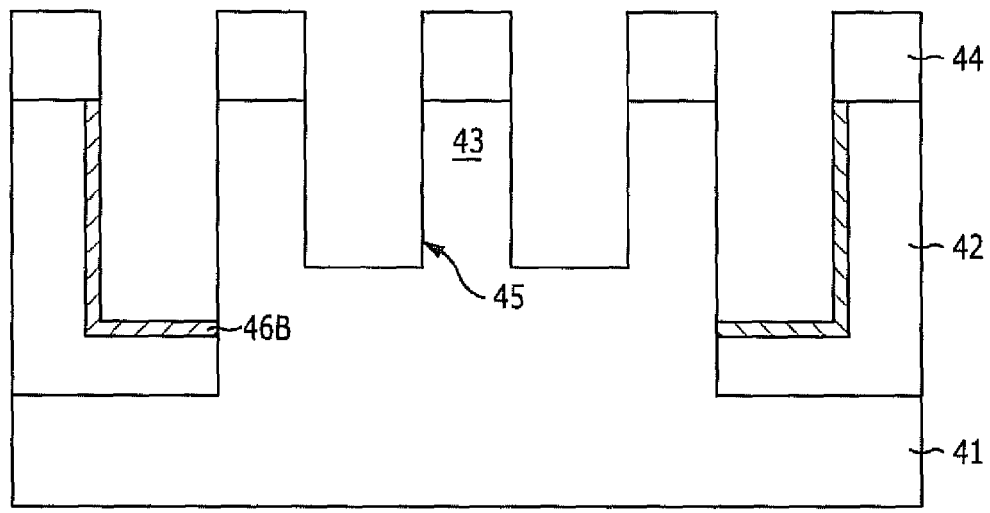

Referring to FIG. 5C, the silicon nitride layer 46A is removed by using a phosphoric acid ($H_3PO_4$) solution. The silicon oxynitride layer 46B is not removed, and thus, remains while the silicon nitride layer 46A is removed. After the silicon nitride layer 46A is removed, the surface of the trench 45 in the active region 43 is exposed.

Figure 5D:
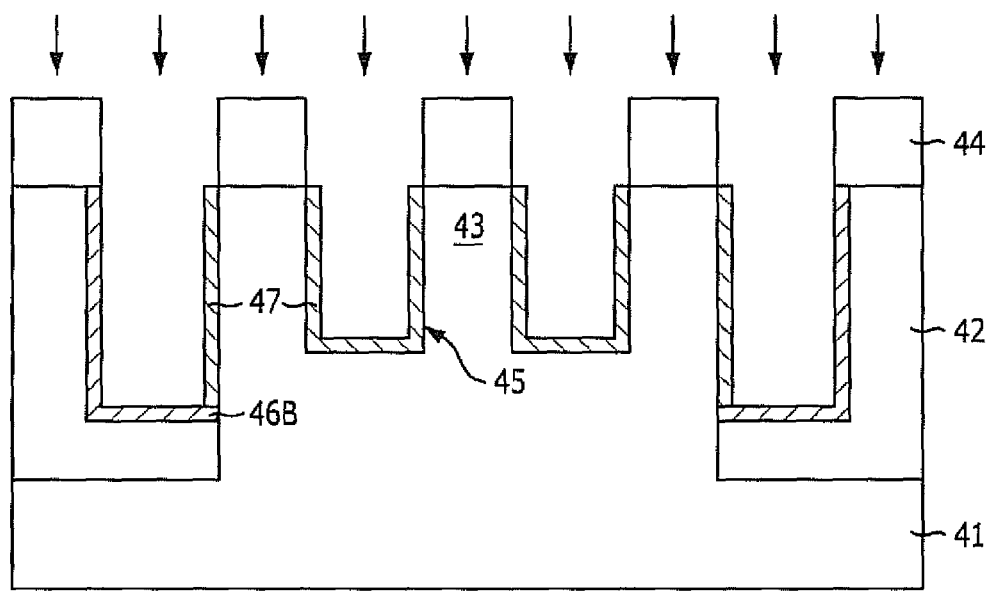

Referring to FIG. 5D, the surface of the trench 45 in the active region 43 is oxidized. The oxidation process of the surface of the trench 45 includes a thermal oxidation, which is a formation process of the conventional gate insulation layer. As the surface of the trench 45 in the active region 43 is oxidized by the oxidation process, a silicon oxide layer ($Si_xO_y$) is formed. Since the semiconductor substrate 41 is silicon substrate, a silicon oxide layer ($SiO_2$) 47 is formed by the oxidation process. The silicon oxynitride layer 46B is exposed during the oxidation process, but the silicon oxynitride layer 46B remains as the silicon oxynitride layer 46B.

Hereinafter, the silicon oxynitride layer 46B formed over the trench 45 in the device isolation layer 42 is denoted as 'the oxidation protecting layer' 46B, and silicon oxide layer 47 formed over the trench 45 in the active region 43 is denoted as 'the gate insulation layer' 47.

Figure 5E:
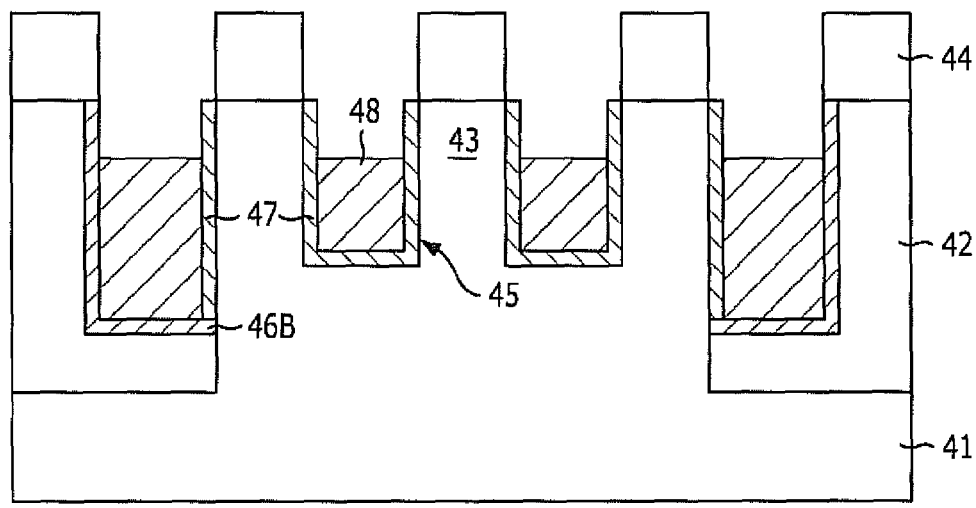

Referring to FIG. 5E, the buried gate 48 filling a portion of the trench 45 is formed by depositing a metal layer to fill the trench 45 with the oxidation protecting layer 46B and the gate insulation layer 47, performing a chemical mechanical polishing (CMP) process, and performing an etch back process. The metal layer includes titanium nitride (TiN), tungsten (W), or a stack structure of the titanium nitride (TiN) and the tungsten (W).

The buried gate 48 fills a portion of the trench 45 in the active region 43 and the portion of the trench 45 in the device isolation layer 42. Since the oxidation protecting layer 46B is formed below the buried gate 48 in the device isolation layer 42, a reaction between the buried gate 48 and the device isolation layer 42 is prevented.

Figure 5F:
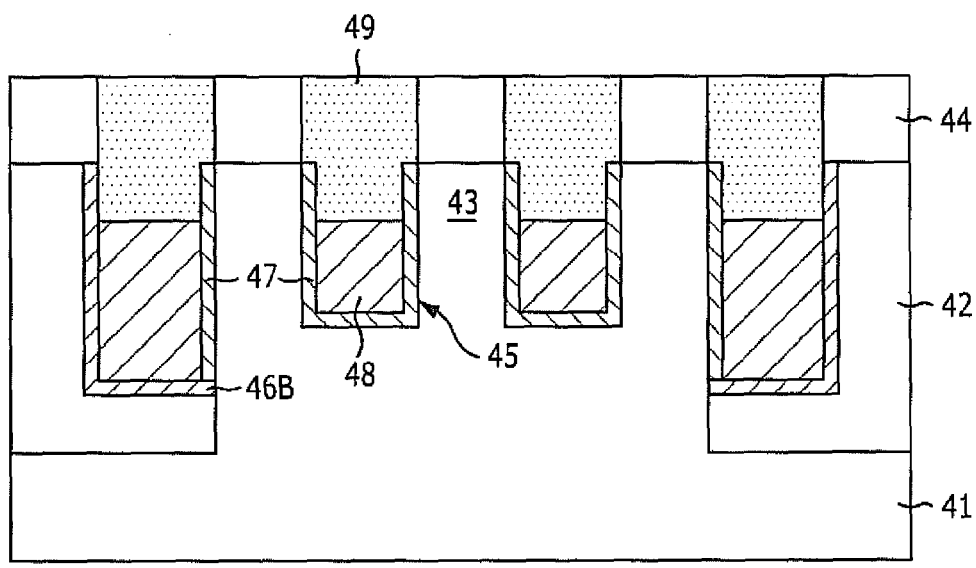

Referring to FIG. 5F, an interlayer insulation layer 49 is formed and planarized to insulate the buried gate 48 from upper contact holes and upper metal lines. The interlayer insulation layer 49 includes a nitride layer, an oxide layer, or a stack structure of the nitride layer and the oxide layer. The interlayer insulation layer 49 includes a spin on dielectric (SOD) formed of a polysilazane (PSZ). The interlayer insulation layer 49 is a silicon oxide layer $SiO_2$ formed by depositing the polysilazane (PSZ) and performing a subsequent high-temperature thermal process (e.g., bake or curing) onto the PSZ in an oxygen environment.

Figure 5G:
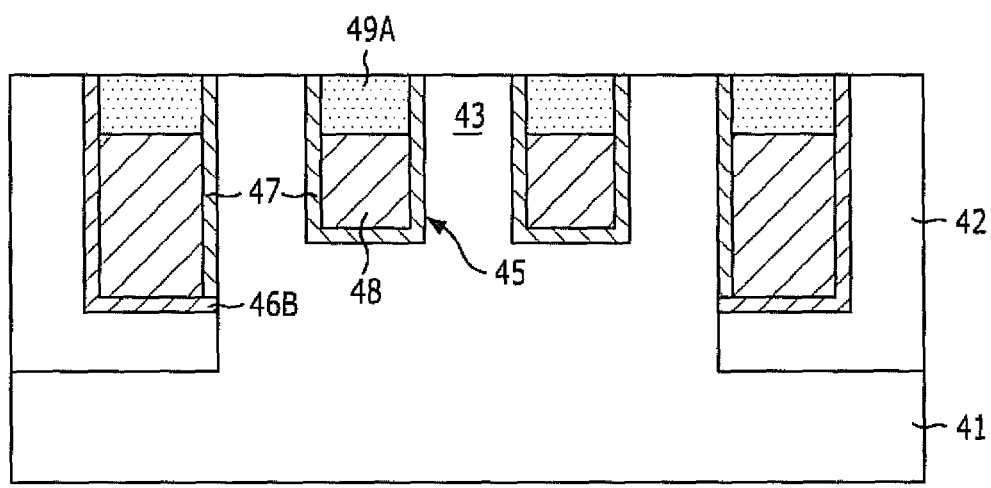

Referring to FIG. 5G, the hard mask 44 is removed. While the hard mask 44 is removed, a portion of the interlayer insulation layer 49 is removed to form an etched interlayer insulation layer 49A. Thus, the etched interlayer insulation layer 49A formed over the buried gate 48 fills the remainder of the trench 45.

According to the second embodiment of the present invention, the oxidation protecting layer 46B is formed between the device isolation layer 42 and the buried gate 48 to prevent the reaction between the buried gate 48 and the device isolation layer 42.

Figure 6:
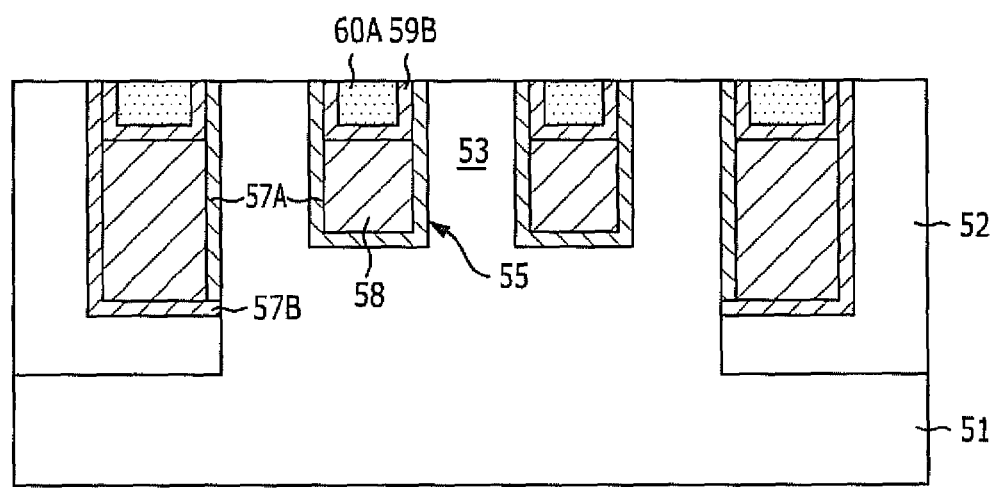
FIG. 6 is a cross-sectional view illustrating a semiconductor device with a buried gate in accordance with a third embodiment of the present invention.

FIG. 6 is a cross-sectional view illustrating a semiconductor device with a buried gate in accordance with a third embodiment of the present invention.

Referring to FIG. 6, the semiconductor device with the buried gate in accordance with the third embodiment of the present invention includes a semiconductor substrate 51, a device isolation layer 52 formed by performing a shallow trench isolation (STI) process to the semiconductor substrate 51, an active region 53 defined by the device isolation layer 52 in the semiconductor substrate 51, a trench 55 formed by etching a portion of the active region 53 and the device isolation layer 52, a buried gate 58 filling a portion of the trench 55, and an interlayer insulation layer 60A formed over the buried gate 58 and filling the remainder of the trench 55, a gate insulation layer 57A formed between the active region 53 and the buried gate 58, a first oxidation protecting layer 57B formed between the device isolation layer 52 and the buried gate 58, and a second oxidation protecting layer 59B formed between the interlayer insulation layer 60A and the buried gate 58.

The trench 55 may be a line-type trench and is formed by etching the portions of the active region 53 and the device isolation layer 52 simultaneously. The depth of the trench 55 in the device isolation layer 52 may be greater than that of the trench 55 in the active region 53 due to a difference in etch selectivity between the device isolation layer 52 and the active region 53. A channel region is formed below the buried gate 58 due to the trench 55, and the length of channel is increased.

The buried gate 58 may be formed of titanium nitride (TiN), tungsten (W), or a stack structure of the titanium nitride (TiN) and the tungsten (W). A sheet resistance of a gate may be decreased remarkably due to the buried gate structure, and thus the buried gate may be applied to a highly integrated semiconductor device under 30 nm. Since the buried gate 58 is formed to fill the portion of the trench 55, the subsequent processes (e.g., contact formation processes) are easily performed, and the buried gate structure has an advantage over a recess gate structure where integration is high.

The interlayer insulation layer 60A may be formed of a nitride layer, an oxide layer, or a stack structure of the nitride layer and the oxide layer. The interlayer insulation layer 60A includes a spin on dielectric (SOD) formed of polysilazane (PSZ) having a good gap-fill characteristic. The interlayer insulation layer 60A is a silicon oxide layer $SiO_2$ formed by depositing the polysilazane (PSZ) and performing a high-temperature thermal process (e.g., bake or curing at temperature more than 800° C.) onto the PSZ in an oxygen environment.

The first oxidation protecting layer 57B prevents a reaction between the buried gate 58 and the device isolation layer 52. Also, the gate insulation layer 57A and the first oxidation protecting layer 57B may be formed of the same material. That is, the first oxidation protecting layer 57B and the gate insulation layer 57A may include an insulation layer formed of a nitride-based material (e.g., silicon oxynitride (SiON)). A method for forming the silicon oxynitride will be described later when a method for fabricating the semiconductor device with the buried gate is described. Contrary to a silicon oxide layer, the silicon oxynitride prevents the reaction between the buried gate 58 and the device isolation layer 52 because the silicon oxynitride contains nitrogen of a predetermined concentration level within the layer. Particularly, when the device isolation layer 52 is formed of a spin on dielectric (SOD), the reaction between the buried gate 58 and the device isolation layer 52 is effectively prevented.

The second oxidation protecting layer 59B includes an oxide layer having a finer layer property than the interlayer insulation layer 60A. The second oxidation protecting layer 59B may be formed of metal oxide layer including at least one material selected from a group consisting of aluminum (Al), zirconium (Zr), tantalum (Ta), yttrium (Y), hafnium (Hf), and titanium (Ti). Alternatively, the second oxidation protecting layer 59B includes at least one selected from a group consisting of $Al_2O_3$, $ZrO_2$, $Ta_2O_5$, $Y_2O_3$, $HfO_2$, and $TiO_2$. The second oxidation protecting layer 59B formed of the above material has a larger dielectric constant than a silicon oxide layer ($SiO_2$). Since the layer property of the second oxidation protecting layer 59B is finer that of the silicon oxide layer, the second oxidation protecting layer 59B effectively prevents oxygen infiltration.

When the spin on dielectric (SOD) including the polysilazane (PSZ) for the interlayer insulation layer 60A is formed by the high-temperature thermal process (e.g., bake or curing at a temperature more than 800° C.), the buried gate 58 may be oxidized by the oxygen infiltration.

In the third embodiment of the present invention, the oxidization of the buried gate 58 is prevented during the high-temperature thermal process to form the interlayer insulation layer 60A by the second oxidation protecting layer 59B formed over the buried gate 58.

The second oxidation protecting layer 59B has a thickness ranging from 2 nm to 10 nm depending on the integration degree. The second oxidation protecting layer 59B having a thickness of more than 10 nm cannot be applied due to the integration degree. It is known that a silicon nitride layer prevents oxygen infiltration. However, when the silicon nitride layer is used as the oxidation protecting layer, the silicon nitride layer must have a thickness of more than 10 nm to effectively prevent oxygen infiltration. Therefore, the silicon nitride layer has a disadvantage where the integration degree is high.

The second oxidation protecting layer 59B is formed at a temperature lower than a temperature for forming the interlayer insulation layer 60A. The second oxidation protecting layer 59B is formed at a temperature lower than 600° C., so that oxidation of the buried gate 58 may not occur. The second oxidation protecting layer 59B is formed by an atomic layer deposition (ALD) or a chemical vapor deposition (CVD) at a temperature lower than 600° C. The deposition process of the second oxidation protecting layer 59B is performed at a temperature ranging from approximately 300° C. to approximately 600° C., under a pressure ranging from tens of mTorr to hundreds of Torr. Also, $Al_2O_3$ used as the second oxidation protecting layer 59B is formed by mixing an aluminum source with a bubbler form, ozone ($O_3$), and argon gas (Ar).

According to the third embodiment of the present invention, the first oxidation protecting layer 57B is formed between the device isolation layer 52 and the buried gate 58 to prevent the reaction between the buried gate 58 and the device isolation layer 52. Also, the second oxidation protecting layer 59B is formed over the buried gate 58 to prevent oxygen infiltration into the buried gate 58 while the interlayer insulation layer 60 is formed.

FIGS. 7A to 7G are cross-sectional views illustrating a method for fabricating the semiconductor device with the buried gate shown in FIG. 6.

Figure 7A:
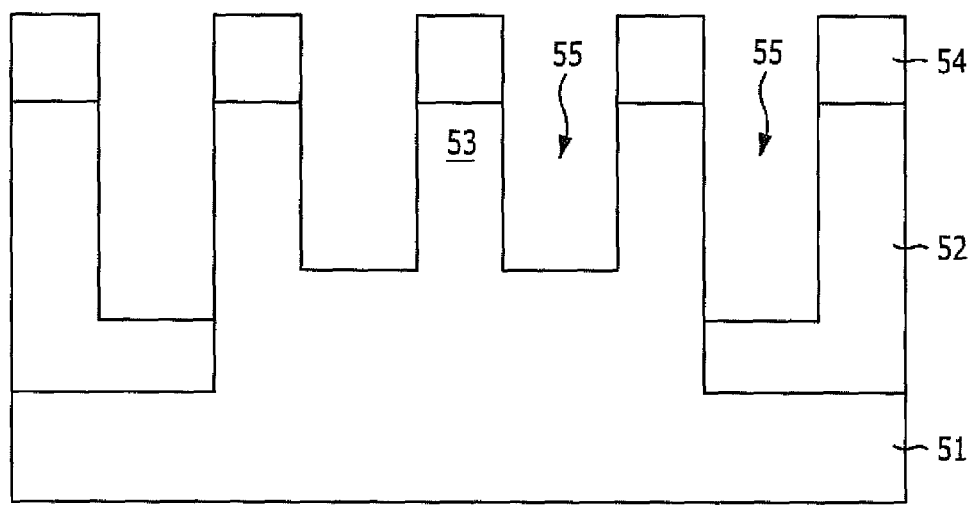
FIGS. 7A to 7G are cross-sectional views illustrating a method for fabricating the semiconductor device with the buried gate shown in FIG. 6.

Referring to FIG. 7A, a device isolation layer 52 is formed by performing a shallow trench isolation (STI) process to a semiconductor substrate 51. The semiconductor substrate 51 includes a silicon substrate, and the device isolation layer 52 includes an oxide layer, such as a high density plasma oxide (HDP oxide) and a spin on dielectric (SOD). That is, the device isolation layer 52 is formed of the SOD having a good gap-fill characteristic. The SOD includes a silicon oxide formed of a polysilazane (PSZ). An active region 53 is defined by the device isolation layer 52.

A trench 55 is formed in a region to be filled with the buried gate 58. The trench 54 is formed by etching the semiconductor substrate 51 using a hard mask 54 as an etch barrier. The trench 55 is formed by etching the active region 53 and the device isolation layer 52. Because a general gate is a line-type, the trench 55 is a line-type too. The line-type trench 55 is formed by etching the active region 53 and the device isolation layer 52 simultaneously. The etch loss of the device isolation layer 52 is larger than that of the active region 53 due to a difference in etch selectivity between the device isolation layer 52 and the active region 53. Therefore, the depth of the trench 55 in the device isolation layer 52 may be greater than that of the trench 55 in the active region 53.

The hard mask 54 is patterned by using a photoresist pattern (not shown). The hard mask 54 is formed of a material having a greater etch selectivity than the semiconductor substrate 51. The hard mask 54 may be a stack structure of an oxide layer and a nitride layer. When the hard mask 54 is applied to form the trench 55, the photoresist pattern may be stripped after the trench 55 is formed.

Figure 7B:
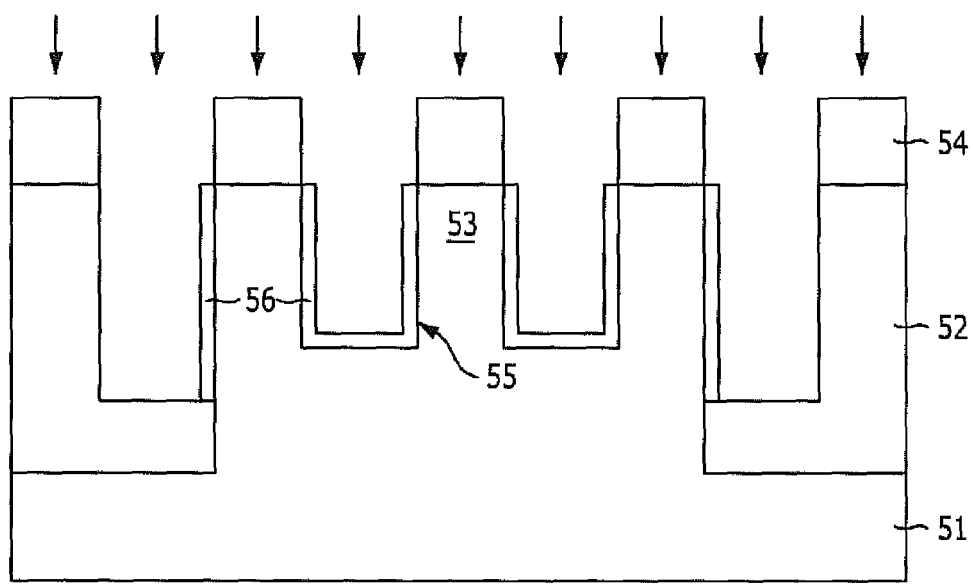

Referring to FIG. 7B, the surface of the trench 55 is oxidized. The oxidation process of the surface of the trench 55 includes a thermal oxidation, which is a formation process of the conventional gate insulation layer.

As the surface of the trench 55 is oxidized by the oxidation process, a silicon oxide layer ($Si_xO_y$) is formed. Since the semiconductor substrate 51 is the silicon substrate, a silicon oxide layer ($SiO_2$) 56 is formed by the oxidation process.

Figure 7C:
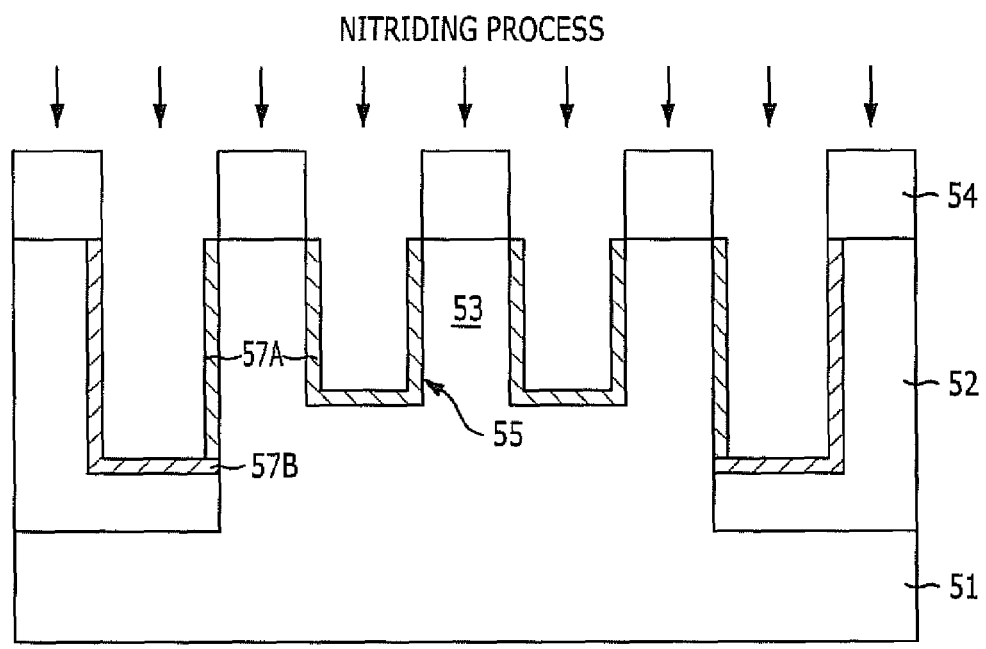

Referring to FIG. 7C, the silicon oxide layer 56 is nitrided by a nitriding process in a nitrogen environment. As a result, a first silicon oxynitride layer (SiON) 57A is formed over the surface of the trench 55 in the active region 53. While the nitriding process is performed, the trench 55 in the device isolation layer 52 is exposed. Thus, the surface of the trench 55 in the device isolation layer 52 is nitrided as well. Also, since the device isolation layer 52 is the silicon oxide layer, a second silicon oxynitride layer (SiON) 57B is formed over the surface of the trench 55 in the device isolation layer 52.

Thus, the first silicon oxynitride layer 57A and the second silicon oxynitride layer 57B cover the bottom and the sidewalls of the trench 55. The first silicon oxynitride layer 57A formed in the active region 53 serves as a gate insulation layer formed below the buried gate 58. The second silicon oxynitride layer 57B formed in the device isolation layer 52 serves as an oxidation protecting layer, which prevents the reaction between the buried gate 58 and the device isolation layer 52. The nitriding process includes a thermal process and a plasma process. The thermal process is performed in a nitrogen environment such as $N_2$ or $NH_3$, at a temperature ranging from approximately 300° C. to approximately 1000° C., under a pressure ranging from tens of mTorr to 760 Torr. The plasma process is performed at a temperature lower than approximately 600° C., under a pressure lower than 10 mTorr in a nitrogen environment such as $N_2$ or $NH_3$.

Hereinafter, the second silicon oxynitride layer 57B formed over the trench 55 in the device isolation layer 52 is denoted as 'the first oxidation protecting layer' 57B, and first silicon oxynitride layer 57A formed over the trench 55 in the active region 53 is denoted as 'the gate insulation layer' 57A.

Figure 7D:
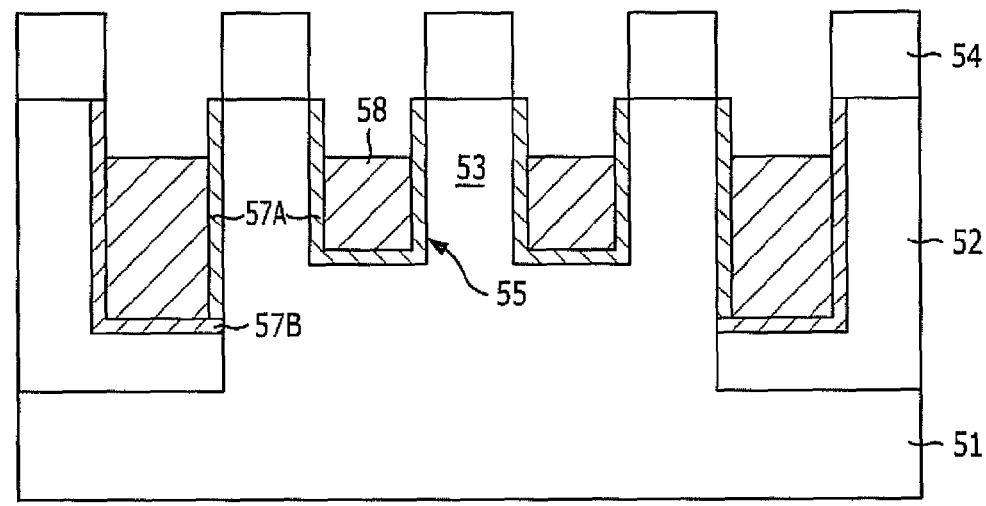

Referring to FIG. 7D, the buried gate 58 filling a portion of the trench 55 is formed by depositing a metal layer to fill the trench 55 with the first oxidation protecting layer 57B and the gate insulation layer 57A, performing a chemical mechanical polishing (CMP) process, and performing an etch back process. The metal layer includes titanium nitride (TiN), tungsten (W), or a stack structure of the titanium nitride (TiN) and the tungsten (W).

The buried gate 58 fills a portion of the trench 55 in the active region 53 and a portion of the trench 55 in the device isolation layer 52. Since the first oxidation protecting layer 57B is formed below the buried gate 58 in the device isolation layer 52, a reaction between the buried gate 58 and the device isolation layer 52 is prevented.

Figure 7E:
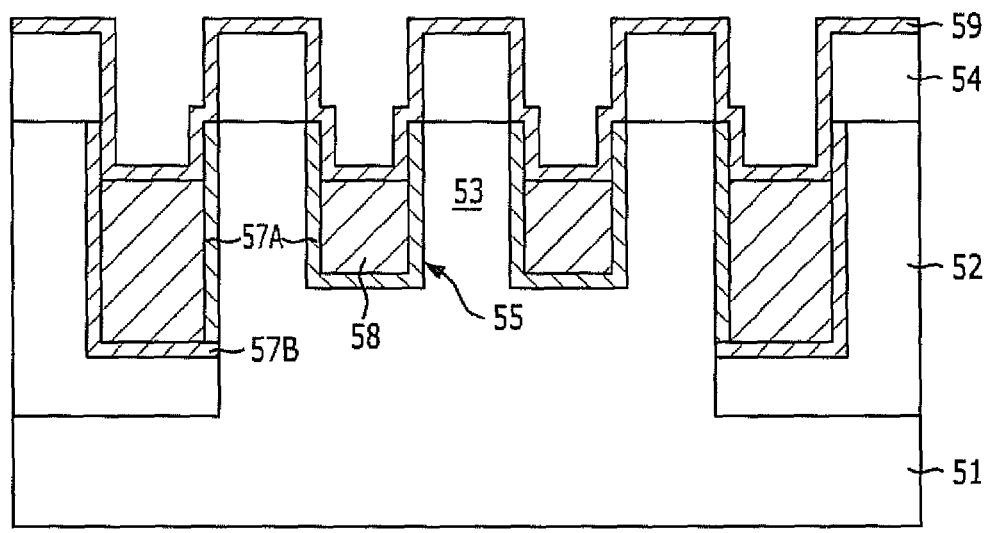

Referring to FIG. 7E, the second oxidation protecting layer 59 is formed over the semiconductor substrate 51 having the buried gate 58. The second oxidation protecting layer 59 prevents the oxidation of the buried gate 58 during the subsequent process of forming an interlayer insulation layer 60 (shown in FIG. 7F). The second oxidation protecting layer 59 thinly covers the semiconductor substrate 51 having the buried gate 58.

The second oxidation protecting layer 59 includes an oxide layer having a finer layer property than the interlayer insulation layer 60. The second oxidation protecting layer 59 may be formed of a metal oxide layer including at least one material selected from a group consisting of aluminum (Al), zirconium (Zr), tantalum (Ta), yttrium (Y), hafnium (Hf), and titanium (Ti). The second oxidation protecting layer 59 includes at least one selected from a group consisting of $Al_2O_3$, $ZrO_2$, $Ta_2O_5$, $Y_2O_3$, $HfO_2$, and $TiO_2$. The second oxidation protecting layer 59 formed of the above material has a larger dielectric constant than a silicon oxide layer ($SiO_2$). Since the layer property of the second oxidation protecting layer 59 is finer than that of the silicon oxide layer, the second oxidation protecting layer 59 effectively prevents oxygen infiltration. In the third embodiment of the present invention, the oxidization of the buried gate 58 is prevented during the formation of the interlayer insulation layer 60 by the second oxidation protecting layer 59 formed over the buried gate 58.

The second oxidation protecting layer 59 has a thickness ranging from 2 nm to 10 nm in consideration of the integration degree. The second oxidation protecting layer 59 having a thickness of more than 10 nm cannot be applied to form the semiconductor device due to the integration degree. It is known that a silicon nitride layer may prevent oxygen infiltration. However, when the silicon nitride layer is used as the oxidation protecting layer, the silicon nitride layer must have a thickness of more than 10 nm in order to effectively prevent oxygen infiltration. Therefore, the silicon nitride layer has a disadvantage where the integration degree is high.

The second oxidation protecting layer 59 is formed at a temperature lower than 600° C., so that oxidation of the buried gate 58 may not occur. The second oxidation protecting layer 59 is formed by an atomic layer deposition (ALD) or a chemical vapor deposition (CVD) at a temperature lower than 600° C. The deposition process of the second oxidation protecting layer 59 is performed at a temperature ranging from approximately 300° C. to approximately 600° C., under a pressure ranging from tens of mTorr to hundreds of Torr. Also, $Al_2O_3$ used as the second oxidation protecting layer 59 is formed by mixing an aluminum source with a bubbler form, ozone ($O_3$), and argon gas (Ar). Although the second oxidation protecting layer 59 and the interlayer insulation layer 60 are oxide-based materials, the second oxidation protecting layer 59 is formed at a temperature lower than a temperature for forming the interlayer insulation layer 60. Therefore, the oxidation of the buried gate 58 may not occur.

Figure 7F:
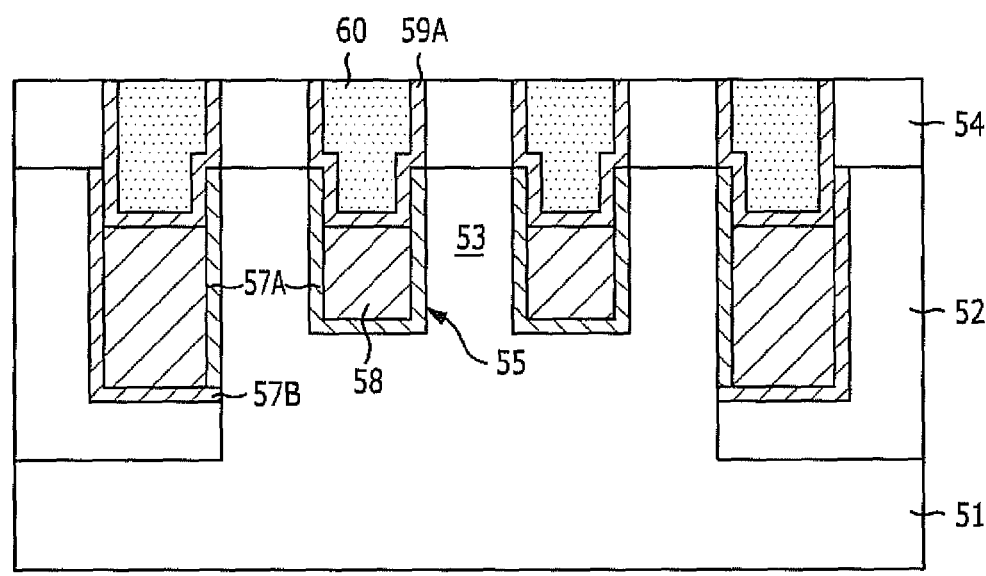

Referring to FIG. 7F, the interlayer insulation layer 60 is formed and planarized to insulate the buried gate 58 from upper contact holes and upper metal lines. The planarization of the interlayer insulation layer 60 is performed until the surface of the hard mask 54 is exposed. Thus, a portion of the second oxidation protecting layer 59 formed over the hard mask 54 is removed, and only the second oxidation protecting layer 59A remains over the buried gate 58.

The interlayer insulation layer 60 includes a nitride layer, an oxide layer, or a stack structure of the nitride layer and the oxide layer. The interlayer insulation layer 60 includes a spin on dielectric (SOD) formed of a polysilazane (PSZ). The interlayer insulation layer 60 is a silicon oxide layer formed by depositing a polysilazane (PSZ) and performing a subsequent high-temperature thermal process (e.g., bake or curing) onto the PSZ in an oxygen environment. When the interlayer insulation layer 60 is formed, the buried gate 58 may have been oxidized by the oxygen infiltration. However, because the second oxidation protecting layer 59A is formed before the interlayer insulation layer 60 is formed, the oxidation of the buried gate 58 is prevented.

Figure 7G:
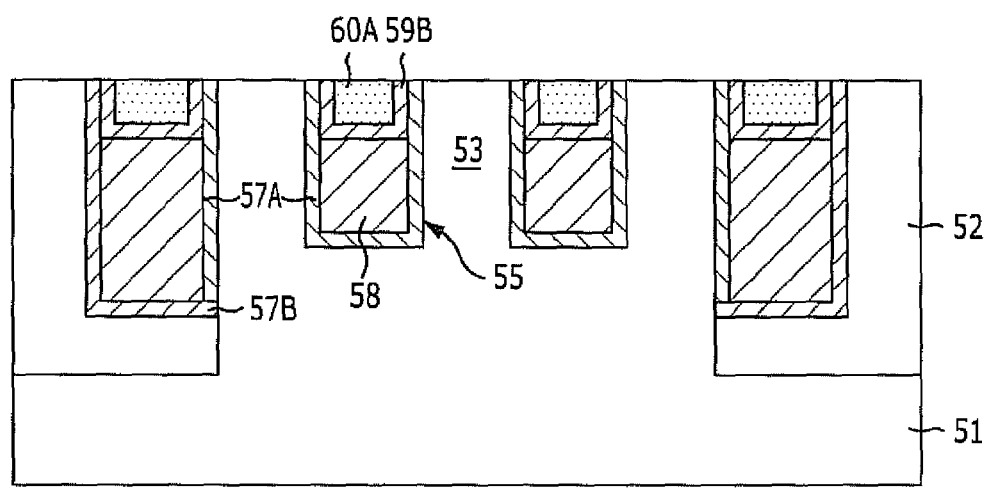

Referring to FIG. 7G, the hard mask 54 is removed. While the hard mask 54 is removed, a portion of the interlayer insulation layer 60 and a portion of the second oxidation protecting layer 59A may be removed, to form an etched interlayer insulation layer 60A and an etched second oxidation protecting layer 59B, respectively. Thus, the etched second oxidation protecting layer 59B and the etched interlayer insulation layer 60A formed over the buried gate 58 fill the remainder of the trench 55.

According to the third embodiment of the present invention, the etched second oxidation protecting layer 59B is formed over the buried gate 58 to prevent oxygen infiltration from the buried gate 58 while the spin on dielectric used for the interlayer insulation layer 60 is deposited. Also, the first oxidation protecting layer 57B is formed between the device isolation layer 52 and the buried gate 58 to prevent the reaction between the buried gate 58 and the device isolation layer 52.

Figure 8:
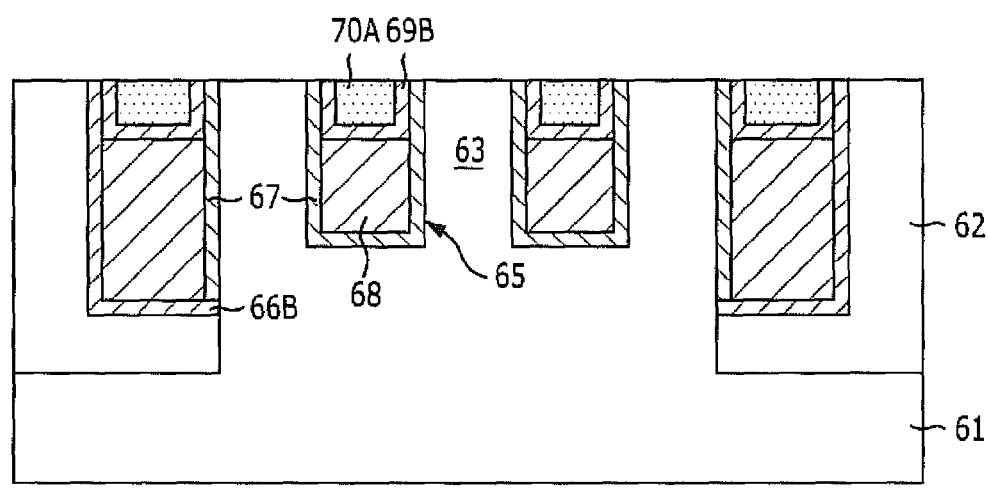
FIG. 8 is a cross-sectional view illustrating a semiconductor device with a buried gate in accordance with a fourth embodiment of the present invention.

FIG. 8 is a cross-sectional view illustrating a semiconductor device with a buried gate in accordance with a fourth embodiment of the present invention.

Referring to FIG. 8, the semiconductor device with the buried gate in accordance with the fourth embodiment of the present invention includes a semiconductor substrate 61, a device isolation layer 62 formed by performing a shallow trench isolation (STI) process to the semiconductor substrate 61, an active region 63 defined by the device isolation layer 62 in the semiconductor substrate 61, a trench 65 formed by etching a portion of the active region 63 and the device isolation layer 62, a buried gate 68 filling a portion of the trench 65, an interlayer insulation layer 70A formed over the buried gate 68 and filling the remainder of the trench 65, a gate insulation layer 67 formed between the active region 63 and the buried gate 68, a first oxidation protecting layer 66B formed between the device isolation layer 62 and the buried gate 68, and a second oxidation protecting layer 69B formed between the interlayer insulation layer 70A and the buried gate 68.

The trench 65 may be a line-type trench and is formed by etching the portions of the active region 63 and the device isolation layer 62 simultaneously. The depth of the trench 65 in the device isolation layer 62 may be greater than that of the trench 65 in the active region 63 due to a difference in etch selectivity between the device isolation layer 62 and the active region 63. A channel region is formed below the buried gate 68 due to the trench 65, and the length of channel is increased.

The buried gate 68 may be formed of titanium nitride (TiN), tungsten (W), or a stack structure of the titanium nitride (TiN) and the tungsten (W). A sheet resistance of a gate may be decreased remarkably due to the buried gate structure, and thus the buried gate may be applied to a highly integrated semiconductor device under 30 nm. Since the buried gate 68 is formed to fill the portion of the trench 65, the subsequent processes (e.g., contact formation processes) are easily performed, and the buried gate structure has an advantage over a recess gate structure where integration is high.

The interlayer insulation layer 70A may be formed of a nitride layer, an oxide layer, or a stack structure of the nitride layer and the oxide layer. The interlayer insulation layer 70A includes a spin on dielectric (SOD) formed of polysilazane (PSZ) having a good gap-fill characteristic. The interlayer insulation layer 70A is a silicon oxide layer $SiO_2$ formed by depositing the polysilazane (PSZ) and performing a high-temperature thermal process (e.g., bake or curing at temperature more than 800° C.) onto the PSZ in an oxygen environment.

The first oxidation protecting layer 66B prevents a reaction between the buried gate 68 and the device isolation layer 62. The first oxidation protecting layer 66B includes a silicon oxynitride (SiON). A method for forming the silicon oxynitride will be described later when a method for fabricating the semiconductor device with the buried gate is described. Contrary to silicon oxide layer, the silicon oxynitride prevents the reaction between the buried gate 68 and the device isolation layer 62 because the silicon oxynitride contains nitrogen of a predetermined concentration level within the layer. Particularly, when the device isolation layer 62 is formed of a spin on dielectric (SOD), the reaction between the buried gate 68 and the device isolation layer 62 is effectively prevented.

The gate insulation layer 67 includes a silicon oxide. A method for forming the silicon oxide will be described later when a method for fabricating the semiconductor device with the buried gate is described.

The second oxidation protecting layer 69B includes an oxide layer having a finer layer property than the interlayer insulation layer 70A. The second oxidation protecting layer 69B may be formed of metal oxide layer including at least one material selected from a group consisting of aluminum (Al), zirconium (Zr), tantalum (Ta), yttrium (Y), hafnium (Hf), and titanium (Ti). Alternatively, the second oxidation protecting layer 69B includes at least one selected from a group consisting of $Al_2O_3$, $ZrO_2$, $Ta_2O_5$, $Y_2O_3$, $HfO_2$, and $TiO_2$. The second oxidation protecting layer 69B formed of the above material has a larger dielectric constant than a silicon oxide layer ($SiO_2$). Since the layer property of the second oxidation protecting layer 69B is finer than that of the silicon oxide layer, the second oxidation protecting layer 69B effectively prevents oxygen infiltration.

When the spin on dielectric (SOD) including the polysilazane (PSZ) for the interlayer insulation layer 70A is formed by the high-temperature thermal process (e.g., bake or curing at a temperature more than 800° C.), the buried gate 68 may be oxidized by the oxygen infiltration.

In the fourth embodiment of the present invention, the oxidization of the buried gate 68 is prevented during the high-temperature thermal process to form the interlayer insulation layer 70A by the second oxidation protecting layer 69B formed over the buried gate 68.

The second oxidation protecting layer 69B has a thickness ranging from 2 nm to 10 nm depending on the integration degree. The second oxidation protecting layer 69B having a thickness of more than 10 nm cannot be applied due to the integration degree. It is known that a silicon nitride layer prevents oxygen infiltration. However, when the silicon nitride layer is used as the oxidation protecting layer, the silicon nitride layer must have a thickness of more than 10 nm to effectively prevent oxygen infiltration. Therefore, the silicon nitride layer has a disadvantage where the integration degree is high.

The second oxidation protecting layer 69B is formed at a temperature lower than a temperature for forming the interlayer insulation layer 70A. The second oxidation protecting layer 69B is formed at a temperature lower than 600° C., so that oxidation of the buried gate 68 may not occur. The second oxidation protecting layer 69B is formed by an atomic layer deposition (ALD) or a chemical vapor deposition (CVD) at a temperature lower than 600° C. The deposition process of the second oxidation protecting layer 69B is performed at a temperature ranging from approximately 300° C. to approximately 600° C., under a pressure ranging from tens of mTorr to hundreds of Torr. Also, $Al_2O_3$ used as the second oxidation protecting layer 69B is formed by mixing an aluminum source with a bubbler form, ozone ($O_3$), and argon gas (Ar). Although the second oxidation protecting layer 69B and the interlayer insulation layer 70A are oxide-based materials, the second oxidation protecting layer 69B is formed at a temperature lower than a temperature for forming the interlayer insulation layer 70A. Therefore, oxidation of the buried gate 68 may not occur.

FIGS. 9A to 9H are cross-sectional views illustrating a method for fabricating the semiconductor device with the buried gate shown in FIG. 8.

Figure 9A:
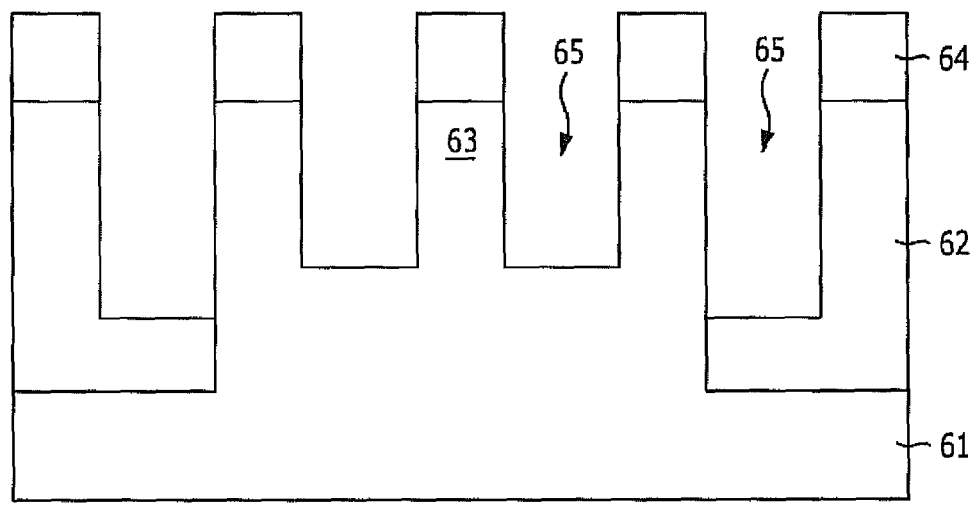
FIGS. 9A to 9H are cross-sectional views illustrating a method for fabricating the semiconductor device with the buried gate shown in FIG. 8.

Referring to FIG. 9A, a device isolation layer 62 is formed by performing a shallow trench isolation (STI) process to a semiconductor substrate 61. The semiconductor substrate 61 includes a silicon substrate, and the device isolation layer 62 includes an oxide layer, such as a high density plasma oxide (HDP oxide) and a spin on dielectric (SOD). That is, the device isolation layer 62 is formed of the SOD having a good gap-fill characteristic. The SOD includes a silicon oxide formed of a polysilazane (PSZ). An active region 63 is defined by the device isolation layer 62.

A trench 65 is formed in a region to be filled with the buried gate 68. The trench 65 is formed by etching the semiconductor substrate 61 using a hard mask 64 as an etch barrier. The trench 65 is formed by etching the active region 63 and the device isolation layer 62. Because a general gate is a line-type, the trench 65 is a line-type too. The line-type trench 65 is formed by etching the active region 63 and the device isolation layer 62 simultaneously. The etch loss of the device isolation layer 62 is larger than that the active region 63 due to a difference in etch selectivity between the device isolation layer 62 and the active region 63. Therefore, the depth of the trench 65 in the device isolation layer 62 may be greater than that of the trench 65 in the active region 63.

The hard mask 64 is patterned by using a photoresist pattern (not shown). The hard mask 64 is formed of a material having a greater etch selectivity than the semiconductor substrate 61. The hard mask 64 may be a stack structure of an oxide layer and a nitride layer. When the hard mask 64 is applied to form the trench 65, the photoresist pattern may be stripped after the trench 65 is formed.

Figure 9B:
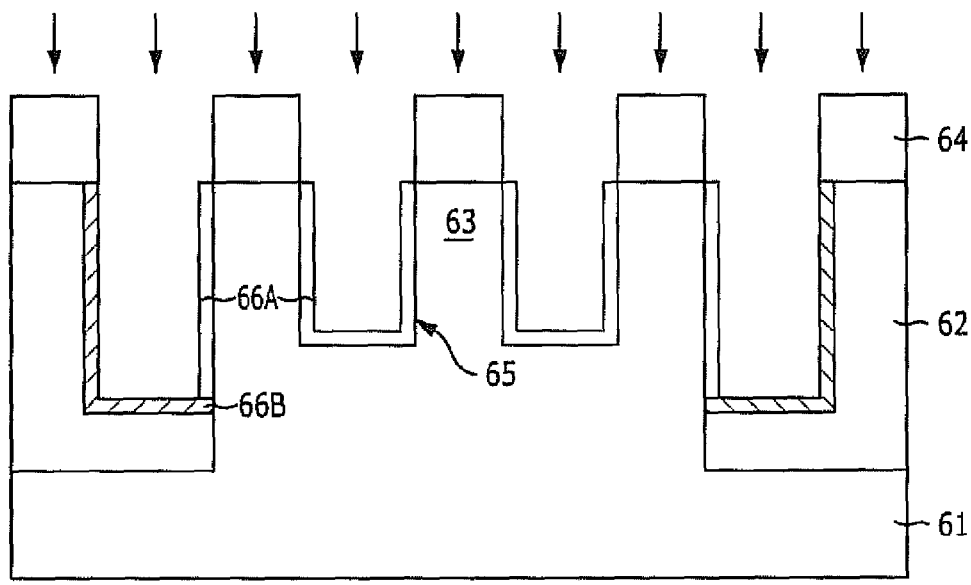

Referring to FIG. 9B, the surface of the trench 65 is nitrided by a nitriding process in a nitrogen environment. As a result, a silicon nitride layer ($Si_3N_4$) 66A is formed over the surface of the trench 65 in the active region 63. While the nitriding process is performed, the trench 65 in the device isolation layer 62 is exposed. Thus, the surface of the trench 65 in the device isolation layer 62 is nitrided as well. Also, since the device isolation layer 62 is the silicon oxide layer, a silicon oxynitride layer (SiON) 66B is formed over the surface of the trench 65 in the device isolation layer 62. The silicon oxynitride layer 66B formed in the device isolation layer 62 serves as an oxidation protecting layer which prevents the reaction between the buried gate 68 and the device isolation layer 62. The nitriding process includes a thermal process and a plasma process. The thermal process is performed in a nitrogen environment, such as $N_2$ or $NH_3$, at a temperature ranging from approximately 300° C. to approximately 1000° C., under a pressure ranging from tens of mTorr to 760 Torr. The plasma process is performed at a temperature lower than approximately 600° C., under a pressure lower than 10 mTorr in a nitrogen environment, such as $N_2$ or $NH_3$.

Figure 9C:
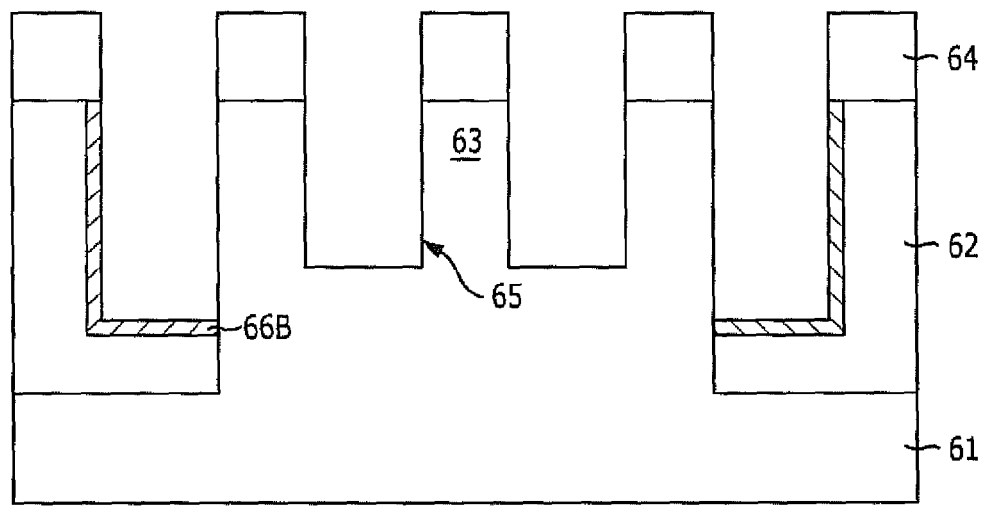

Referring to FIG. 9C, the silicon nitride layer 66A is removed by using a phosphoric acid ($H_3PO_4$) solution. The silicon oxynitride layer 66B is not removed, and thus, remains while the silicon nitride layer 66A is removed. After the silicon nitride layer 66A is removed, the surface of the trench 65 in the active region 63 is exposed.

Figure 9D:
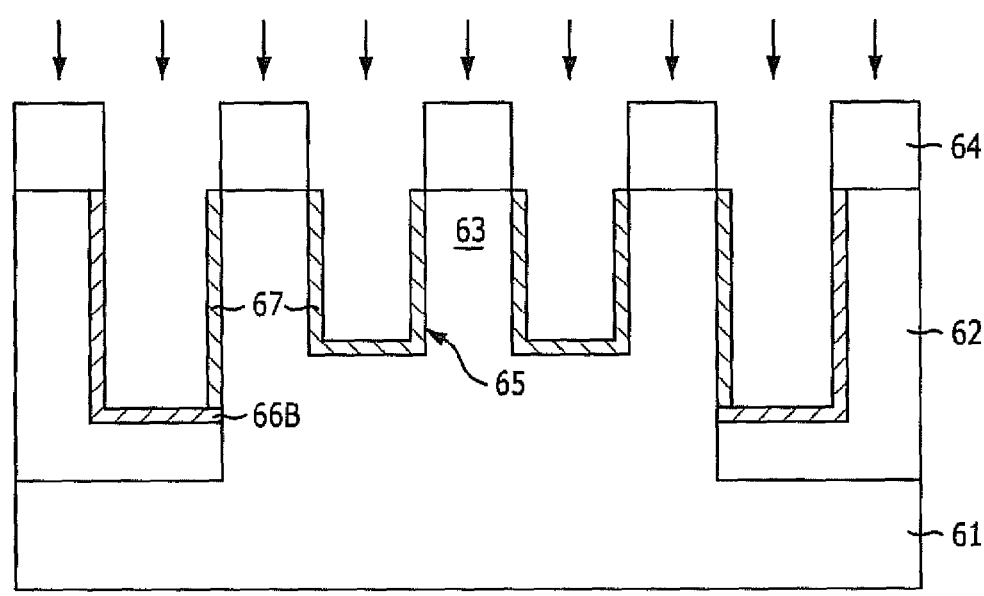

Referring to FIG. 9D, the surface of the trench 65 in the active region 63 is oxidized. The oxidation process of the surface of the trench 65 includes a thermal oxidation, which is a formation process of the conventional gate insulation layer. As the surface of the trench 65 in the active region 63 is oxidized by the oxidation process, a silicon oxide layer ($Si_xO_y$) is formed. Since the semiconductor substrate 61 is silicon substrate, a silicon oxide layer ($SiO_2$) 67 is formed by the oxidation process. The silicon oxynitride layer 66B is exposed during the oxidation process, but the silicon oxynitride layer 66B remains as the silicon oxynitride layer 66.

Hereinafter, the silicon oxynitride layer 66B formed over the trench 65 in the device isolation layer 62 is denoted as 'a first oxidation protecting layer' 66B, and silicon oxide layer 67 formed over the trench 65 in the active region 63 is denoted as 'a gate insulation layer' 67.

Figure 9E:
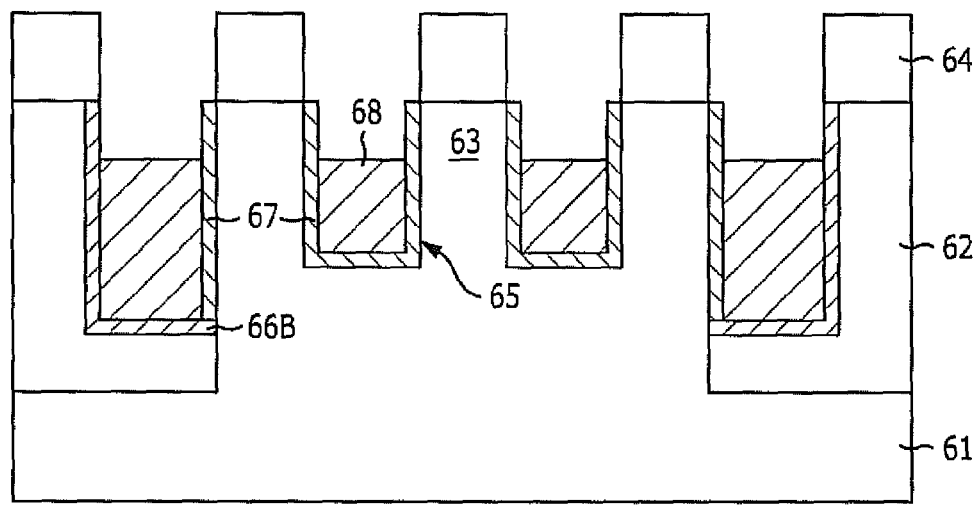

Referring to FIG. 9E, the buried gate 68 filling a portion of the trench 65 is formed by depositing a metal layer to fill the trench 65 with the first oxidation protecting layer 66B and the gate insulation layer 67, performing a chemical mechanical polishing (CMP) process and performing an etch back process. The metal layer includes titanium nitride (TiN), tungsten (W), or a stack structure of the titanium nitride (TiN) and the tungsten (W).

The buried gate 68 fills a portion of the trench 65 in the active region 63 and the portion of the trench 65 in the device isolation layer 62. Since the first oxidation protecting layer 66B is formed below the buried gate 68 in the device isolation layer 62, a reaction between the buried gate 68 and the device isolation layer 62 is prevented.

Figure 9F:
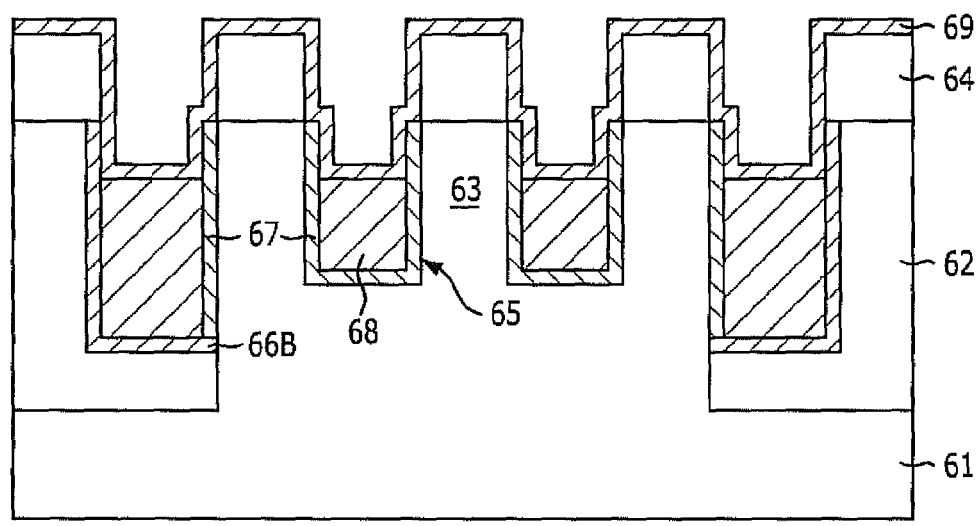

Referring to FIG. 9F, the second oxidation protecting layer 69 is formed over the semiconductor substrate 61 having the buried gate 68. The second oxidation protecting layer 69 prevents the oxidation of the buried gate 68 during the subsequent process of forming an interlayer insulation layer 70 (shown in FIG. 9G). The second oxidation protecting layer 69 thinly covers the semiconductor substrate 61 having the buried gate 68.

The second oxidation protecting layer 69 includes an oxide layer having a finer layer property than the interlayer insulation layer 70. The second oxidation protecting layer 69 may be formed of a metal oxide layer including at least one material selected from a group consisting of aluminum (Al), zirconium (Zr), tantalum (Ta), yttrium (Y), hafnium (Hf), and titanium (Ti). The second oxidation protecting layer 69 includes at least one selected from a group consisting of $Al_2O_3$, $ZrO_2$, $Ta_2O_5$, $Y_2O_3$, $HfO_2$, and $TiO_2$. The second oxidation protecting layer 69 formed of the above material has a larger dielectric constant than a silicon oxide layer ($SiO_2$). Since the layer property of the second oxidation protecting layer 69 is finer than that of the silicon oxide layer, the second oxidation protecting layer 69 effectively prevents oxygen infiltration. In the fourth embodiment of the present invention, the oxidization of the buried gate 68 is prevented during the formation of the interlayer insulation layer 70 by the second oxidation protecting layer 69 formed over the buried gate 68.

The second oxidation protecting layer 69 has a thickness ranging from 2 nm to 10 nm in consideration of the integration degree. The second oxidation protecting layer 69 having a thickness of more than 10 nm cannot be applied to form the semiconductor device due to the integration degree. It is known that a silicon nitride layer may prevent oxygen infiltration. However, when the silicon nitride layer is used as the oxidation protecting layer, the silicon nitride layer must have a thickness of more than 10 nm in order to effectively prevent oxygen infiltration. Therefore, the silicon nitride layer has a disadvantage where the integration degree is high.

The second oxidation protecting layer 69 is formed at a temperature lower than 600° C., so that oxidation of the buried gate 68 may not occur. The second oxidation protecting layer 69 is formed by an atomic layer deposition (ALD) or a chemical vapor deposition (CVD) at a temperature lower than 600° C. The deposition process of the second oxidation protecting layer 69 is performed at a temperature ranging from approximately 300° C. to approximately 600° C., under a pressure ranging from tens of mTorr to hundreds of Torr. Also, $Al_2O_3$ used as the second oxidation protecting layer 69 is formed by mixing an aluminum source with a bubbler form, ozone ($O_3$), and argon gas (Ar). Although the second oxidation protecting layer 69 and the interlayer insulation layer 70 are oxide-based materials, the second oxidation protecting layer 69 is formed at a temperature lower than a temperature for forming the interlayer insulation layer 70. Therefore, the oxidation of the buried gate 68 may not occur.

Figure 9G:
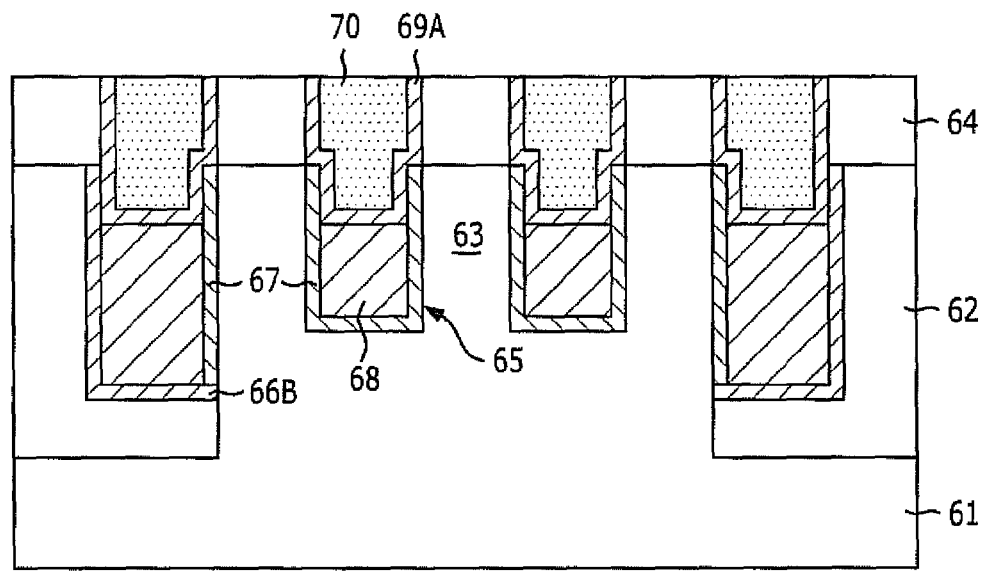

Referring to FIG. 9G, the interlayer insulation layer 70 is formed and planarized to insulate the buried gate 68 from upper contact holes and upper metal lines. The planarization of the interlayer insulation layer 70 is performed until the surface of the hard mask 64 is exposed. Thus, a portion of the second oxidation protecting layer 69 formed over the hard mask 64 is removed, and only the second oxidation protecting layer 69A remains over the buried gate 68.

The interlayer insulation layer 70 includes a nitride layer, an oxide layer, or a stack structure of the nitride layer and the oxide layer. The interlayer insulation layer 70 includes a spin on dielectric (SOD) formed of a polysilazane (PSZ). The interlayer insulation layer 70 is a silicon oxide layer formed by depositing a polysilazane (PSZ) and performing a subsequent high-temperature thermal process (e.g., bake or curing) onto the PSZ in an oxygen environment. When the interlayer insulation layer 70 is formed, the buried gate 68 may have been oxidized by the oxygen infiltration. However, because the second oxidation protecting layer 69A is formed before the interlayer insulation layer 70 is formed, the oxidation of the buried gate 68 is prevented.

Figure 9H:
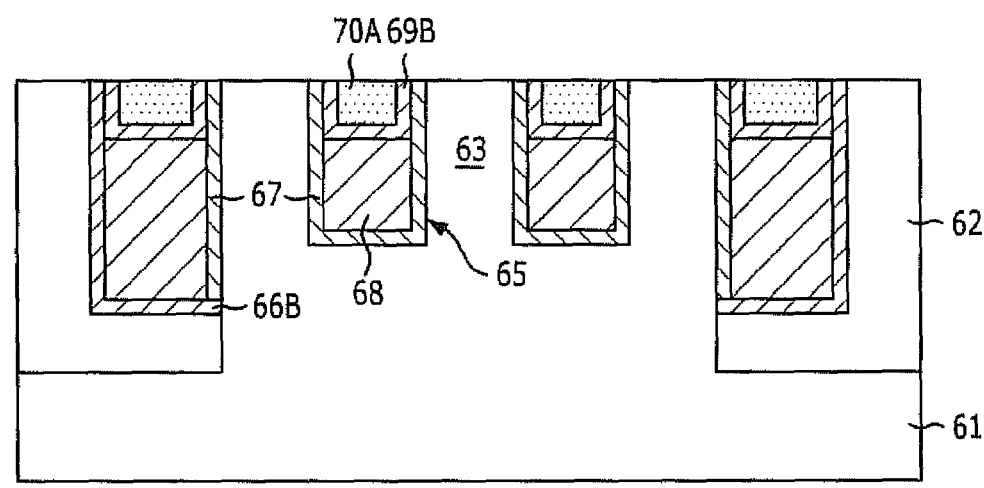

Referring to FIG. 9H, the hard mask 64 is removed. While the hard mask 64 is removed, a portion of the interlayer insulation layer 70 and a portion of the second oxidation protecting layer 69A may be removed, to form an etched interlayer insulation layer 70A and an etched second oxidation protecting layer 69B, respectively. Thus, the etched second oxidation protecting layer 69B and the etched interlayer insulation layer 70A formed over the buried gate 68 fill the remainder of the trench 65.

According to the fourth embodiment of the present invention, the etched second oxidation protecting layer 69B is formed over the buried gate 68 to prevent oxygen infiltration from the buried gate 68 while the spin on dielectric used for the interlayer insulation layer 70 is deposited. Also, the first oxidation protecting layer 66B is formed between the device isolation layer 62 and the buried gate 68 to prevent the reaction between the buried gate 68 and the device isolation layer 62.

When the interlayer insulation layer is formed, oxidation of the buried gate may be prevented by using an oxidation protecting layer having a finer layer property and formed at a temperature lower than a temperature used for forming the interlayer insulation layer.

Also, the reliability of the semiconductor device may be improved by preventing a reaction between the device isolation layer and the buried gate.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   providing a substrate having an active region defined by a device isolation layer;
   forming a trench in the active region and a trench in the device isolation layer by etching the active region and the device isolation layer;
   performing a nitriding process to form an oxidation protecting layer over the trench in the device isolation layer, and to form a gate insulation layer over the trench in the active region;
   forming a buried gate filling a portion of each trench, in each trench; and
   forming an interlayer insulation layer filling a remainder of each trench, over the buried gate,
   wherein the performing of a nitriding process comprises:
      forming a silicon nitride layer over the trench in the active region while a silicon oxynitride layer is formed over the trench in the device isolation layer as the oxidation protecting layer;
      removing the silicon nitride layer to expose a surface of the trench in the active region: and
      forming the gate insulation layer over the trench in the active region by performing an oxidizing process to the trench in the active region.

2. A method for fabricating a semiconductor device, comprising:
   providing a substrate having an active region defined by a device isolation layer;
   forming a trench in the active region and a trench in the device isolation layer by etching the active region and the device isolation layer;
   forming a first oxidation protecting layer over the trench in the device isolation layer;
   forming a gate insulation layer over the trench in the active region;
   forming a buried gate filling a portion of each trench, in each trench;
   forming a second oxidation protecting layer along to a profile of a top surface of the buried gate and sidewalls of each trench, wherein the second oxidation protecting layer is formed to have an opening in an inside thereof; and forming an interlayer insulation layer within the opening of the second oxidation protecting layer at a temperature higher than a temperature for the forming of the oxidation protecting layer, thereby gap-filling a remainder of each trench, wherein the forming of the gate insulation layer includes:
forming a silicon nitride layer over the trench in the active region by performing a nitriding process while a silicon oxynitride layer is formed over the trench in the device isolation layer;
removing the silicon nitride layer to expose the surface of the trench in the active region: and
forming the gate insulation layer by performing an oxidizing process to the trench in the active region.

3. The method of claim 2, wherein the forming of the second oxidation protecting layer includes forming an oxide layer at the temperature lower than the temperature used for the forming of the interlayer insulation layer.

4. The method of claim 2, wherein the forming of the second oxidation protecting layer is performed at a temperature ranging from approximately 300° C. to approximately 600° C.

5. The method of claim 2, wherein the second oxidation protecting layer includes a metal oxide layer.

6. The method of claim 5, wherein the metal oxide layer includes at least one selected from a group consisting of $Al_2O_3$, $ZrO_2$, $Ta_2O_5$, $Y_2O_3$, $HfO_2$, and $TiO_2$.

7. The method of claim 2, wherein the first oxidation protecting layer includes a silicon oxynitride layer (SiON).

8. The method of claim 2, wherein the gate insulation layer includes a silicon oxide layer.

9. The method of claim 2, wherein the forming of the first oxidation protecting layer includes:
forming a silicon oxynitride layer over the trench in the device isolation layer by performing a nitriding process.

10. The method of claim 9, wherein the performing of the nitriding process includes performing a thermal process and a plasma process in a nitrogen environment.

11. The method of claim 2, wherein the removing of the silicon nitride layer is performed using a phosphoric acid ($H_3PO_4$) solution.

12. The method of claim 9, wherein the device isolation layer includes a spin on dielectric (SOD) formed of polysilazane (PSZ).

13. The method of claim 9, wherein the buried gate includes titanium nitride (TiN), tungsten (W), or a stack structure of the titanium nitride (TiN) and the tungsten (W).

14. The method of claim 10, wherein the nitrogen environment includes $N_2$ or $NH_3$.

15. The method of claim 1, wherein the removing of the silicon nitride layer is performed using a phosphoric acid ($H_3PO_4$) solution.

* * * * *